(12) United States Patent
Chang et al.

(10) Patent No.: US 10,056,487 B2
(45) Date of Patent: Aug. 21, 2018

(54) STRAINED SEMICONDUCTOR NANOWIRE

(71) Applicant: International Business Machines Corporation, Armonk, NY (US)

(72) Inventors: Josephine B. Chang, Mahopac, NY (US); Isaac Lauer, Yorktown Heights, NY (US); Chung-Hsun Lin, White Plains, NY (US); Jeffrey W. Sleight, Ridgefield, CT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/365,538

(22) Filed: Nov. 30, 2016

(65) Prior Publication Data
US 2017/0084745 A1 Mar. 23, 2017

Related U.S. Application Data

(62) Division of application No. 14/135,668, filed on Dec. 20, 2013, now Pat. No. 9,530,876.

(51) Int. Cl.
*H01L 29/775* (2006.01)
*H01L 29/66* (2006.01)
(Continued)

(52) U.S. Cl.
CPC .......... *H01L 29/7848* (2013.01); *B82Y 10/00* (2013.01); *B82Y 40/00* (2013.01);
(Continued)

(58) Field of Classification Search
CPC ............... B82Y 10/00; H01L 29/0665; H01L 29/42392; H01L 29/66439; H01L 29/775; H01L 29/78696
(Continued)

(56) References Cited

U.S. PATENT DOCUMENTS 7,361,563 B2   4/2008  Shin et al.
7,378,305 B2   5/2008  Hatada et al.
(Continued)

FOREIGN PATENT DOCUMENTS

| CN | 1805144 A | 7/2006 |
|----|-----------|--------|
| CN | 1937182 A | 3/2007 |
| JP | 2012089784 A | 5/2012 |
| KR | 1020060089978 A | 8/2006 |
| WO | 2013095650 A1 | 6/2013 |

OTHER PUBLICATIONS

Liow, T.Y. et al., "Strained Silicon Nanowire Transistors With Germanium Source and Drain Stressors" IEEE Transactions on Electron Devices (Nov. 2008) pp. 3048-3055, vol. 55, No. 11.

*Primary Examiner* — Jonathan Han
(74) *Attorney, Agent, or Firm* — Scully, Scott, Murphy & Presser, P.C.; Louis J. Percello, Esq.

(57) ABSTRACT

At least one semiconductor nanowire laterally abutted by a pair of semiconductor pad portions is formed over an insulator layer. Portions of the insulator layer are etched from underneath the at least one semiconductor nanowire such that the at least one semiconductor nanowire is suspended. A temporary fill material is deposited over the at least one semiconductor nanowire, and is planarized to physically expose top surfaces of the pair of semiconductor pad portions. Trenches are formed within the pair of semiconductor pad portions, and are filled with stress-generating materials. The temporary fill material is subsequently removed. The at least one semiconductor nanowire is strained along the lengthwise direction with a tensile strain or a compressive strain.

19 Claims, 21 Drawing Sheets

(51) Int. Cl.
*H01L 29/78* (2006.01)
*B82Y 10/00* (2011.01)
*B82Y 40/00* (2011.01)
*H01L 29/06* (2006.01)
*H01L 21/306* (2006.01)
*H01L 21/308* (2006.01)
*H01L 21/3105* (2006.01)
*H01L 21/311* (2006.01)
*H01L 29/423* (2006.01)
*H01L 29/786* (2006.01)

(52) U.S. Cl.
CPC ...... *H01L 21/308* (2013.01); *H01L 21/30604* (2013.01); *H01L 21/31051* (2013.01); *H01L 21/31111* (2013.01); *H01L 29/0673* (2013.01); *H01L 29/42392* (2013.01); *H01L 29/66439* (2013.01); *H01L 29/66636* (2013.01); *H01L 29/66742* (2013.01); *H01L 29/775* (2013.01); *H01L 29/78696* (2013.01)

(58) Field of Classification Search
USPC ........ 438/151, 479; 257/9, 12; 977/938, 762
See application file for complete search history.

(56) References Cited

U.S. PATENT DOCUMENTS

| | | | |
|---|---|---|---|
| 7,591,659 B2 | 9/2009 | Chen et al. | |
| 7,855,126 B2 | 12/2010 | Shin et al. | |
| 7,902,008 B2 | 3/2011 | Peidous et al. | |
| 7,989,233 B2 | 8/2011 | Sekaric et al. | |
| 8,071,481 B2 | 12/2011 | Kao et al. | |
| 8,105,887 B2 | 1/2012 | Luo et al. | |
| 8,169,026 B2 | 5/2012 | Luo et al. | |
| 8,399,314 B2 | 3/2013 | Cohen et al. | |
| 8,445,892 B2 | 5/2013 | Cohen et al. | |
| 9,087,863 B2 | 7/2015 | Cea et al. | |
| 2008/0128760 A1* | 6/2008 | Jun | B82Y 10/00 257/280 |
| 2010/0252800 A1* | 10/2010 | Chidambarrao | B82Y 10/00 257/9 |
| 2011/0012176 A1* | 1/2011 | Chidambarrao | B82Y 10/00 257/255 |
| 2011/0049473 A1* | 3/2011 | Chidambarrao | B82Y 10/00 257/24 |
| 2011/0095267 A1* | 4/2011 | Bryant | B82Y 10/00 257/24 |
| 2012/0302019 A1 | 11/2012 | Cheng et al. | |

\* cited by examiner

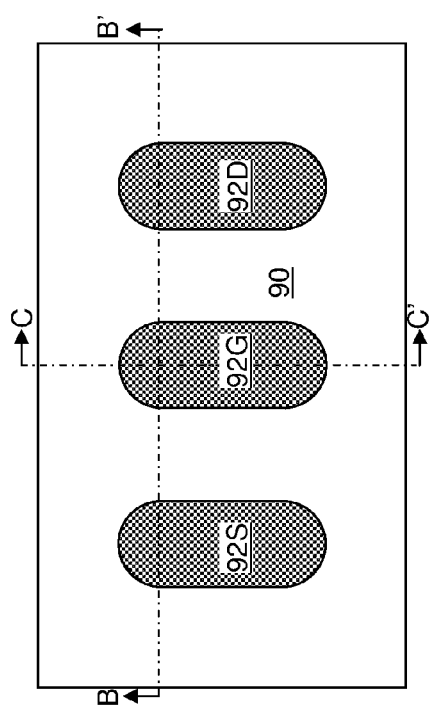
FIG. 11A
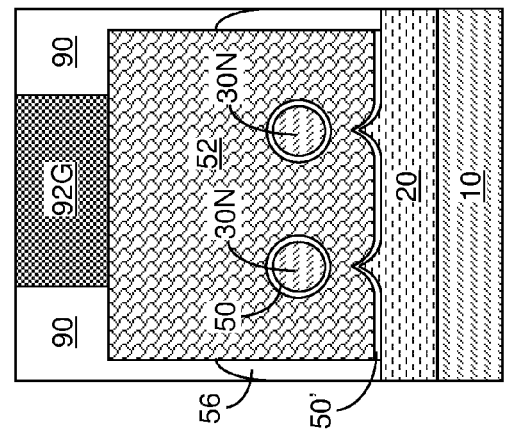
FIG. 11B
FIG. 11C

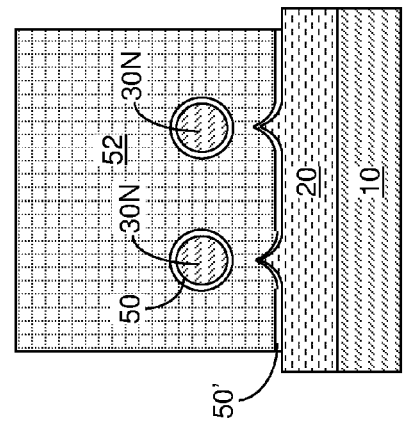
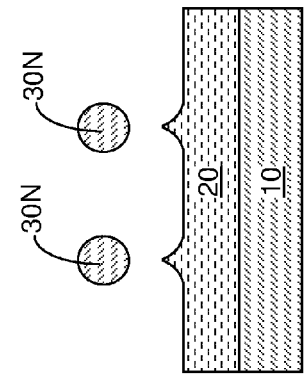
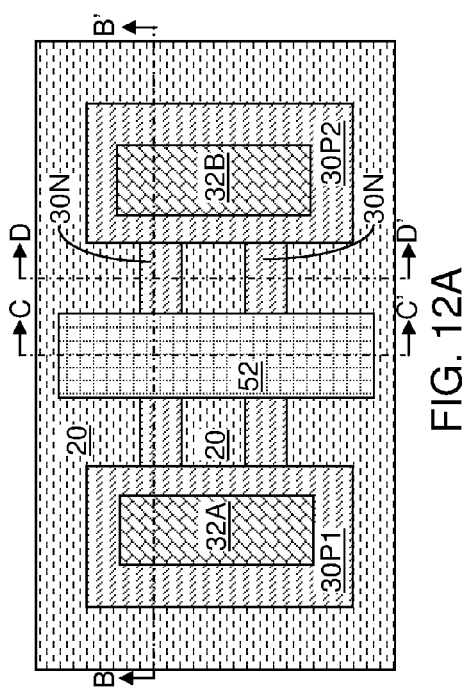
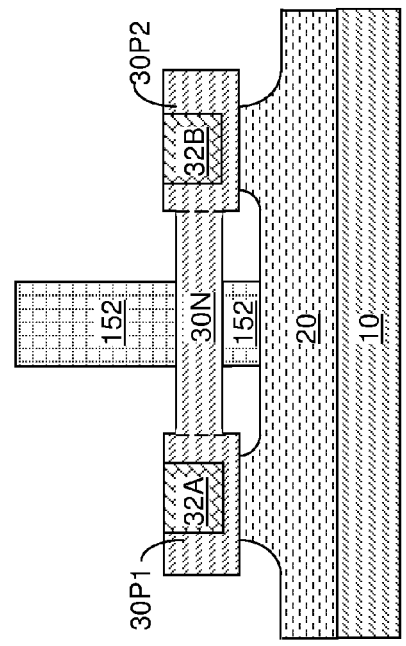

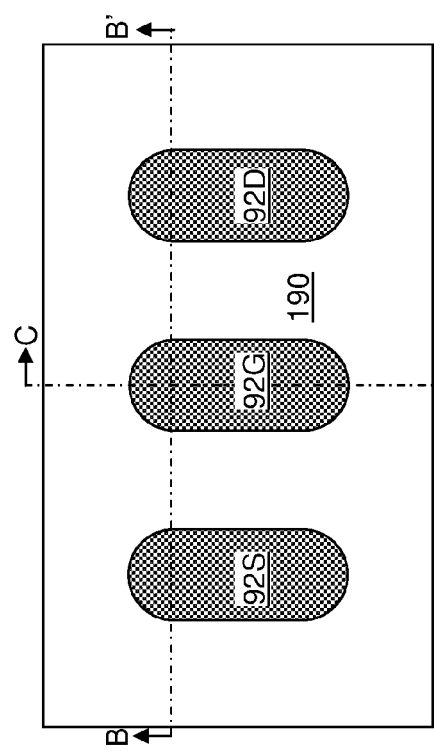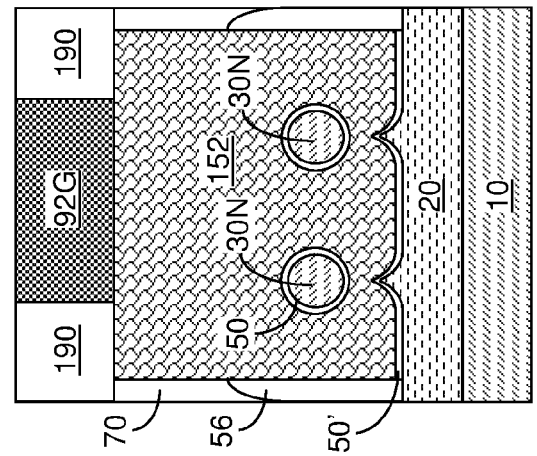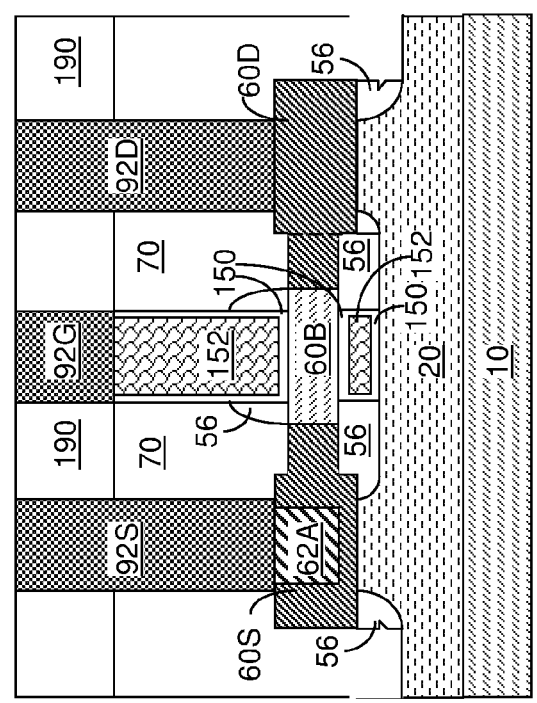

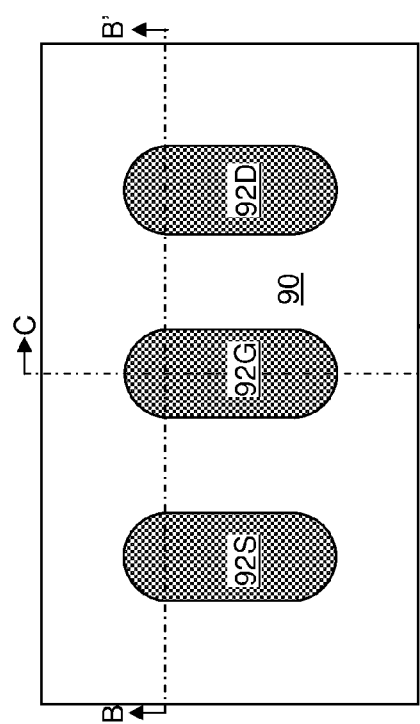
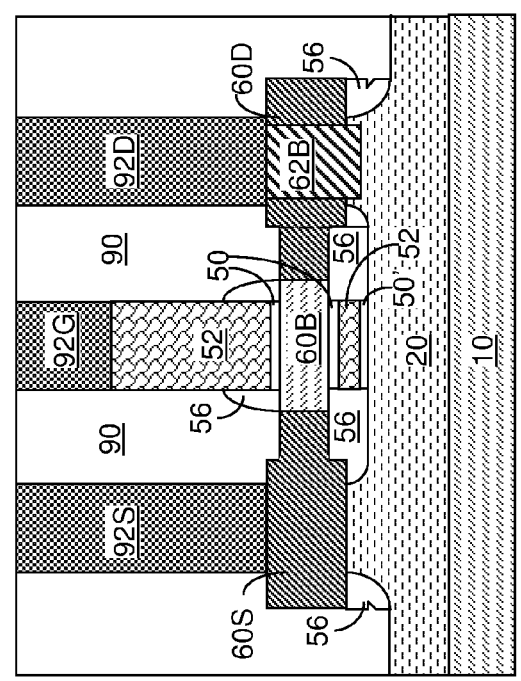
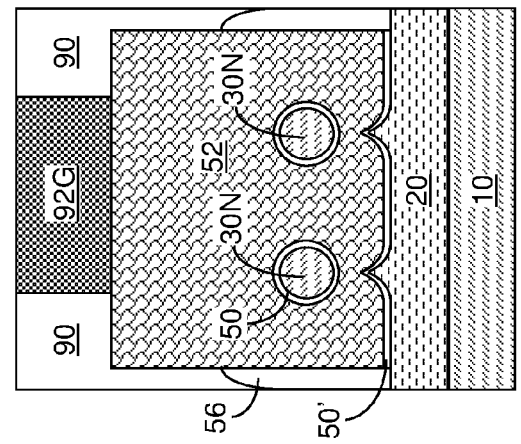

STRAINED SEMICONDUCTOR NANOWIRE

BACKGROUND

The present disclosure relates to a semiconductor structure, and particularly to a strained semiconductor nanowire, and a method of manufacturing the same.

Strain in a channel portion of a field effect transistor is known to change the mobility of charge carriers. For example, compressive strain in the channel increases the mobility of holes in a p-type field effect transistor, and tensile strain in the channel increases the mobility of electrons in an n-type field effect transistor. However, introducing strain into semiconductor nanowires has been difficult because of the small lateral dimensions of the semiconductor nanowires.

SUMMARY

At least one semiconductor nanowire laterally abutted by a pair of semiconductor pad portions is formed over an insulator layer. Portions of the insulator layer are etched from underneath the at least one semiconductor nanowire such that the at least one semiconductor nanowire is suspended. A temporary fill material is deposited over the at least one semiconductor nanowire, and is planarized to physically expose top surfaces of the pair of semiconductor pad portions. Trenches are formed within the pair of semiconductor pad portions, and are filled with stress-generating materials. The temporary fill material is subsequently removed. The at least one semiconductor nanowire is strained along the lengthwise direction with a tensile strain or a compressive strain.

According to an aspect of the present disclosure, a semiconductor structure is provided. The semiconductor structure includes an insulator layer containing two pedestal portions that protrude above a top surface between the two pedestal portions. Further, the semiconductor structure includes a contiguous semiconductor material portion, which contains a first semiconductor pad portion overlying one of the two pedestal portions, a second semiconductor pad portion overlying another of the two pedestal portions, and a semiconductor nanowire adjoined to sidewalls of the first and second semiconductor pad portions and suspended over the top surface. In addition, the semiconductor structure includes at least one stress-generating material portion embedded in a trench within one of the first semiconductor pad portion and the second semiconductor pad portion. The semiconductor nanowire is strained along a lengthwise direction by a stress generated by the at least one stress-generating material portion.

According to another aspect of the present disclosure, a method of forming a semiconductor structure is provided. A semiconductor material portion is formed on an insulator layer. The semiconductor material portion includes a first semiconductor pad portion, a second semiconductor pad portion laterally spaced from the first semiconductor pad portion, and a semiconductor nanowire adjoined to sidewalls of the first and second semiconductor pad portions and suspended over the insulator layer. The insulator layer includes two pedestal portions underlying the first and second semiconductor pad portions. At least one trench is formed within at least one of the first and second semiconductor pad portions. The semiconductor nanowire is strained along a lengthwise direction by filling the at least one trench with a stress-generating material.

BRIEF DESCRIPTION OF SEVERAL VIEWS OF THE DRAWINGS

FIG. 11A is a top-down view of the first exemplary semiconductor structure after formation of a contact level dielectric layer and various contact via structures according to the first embodiment of the present disclosure.

FIG. 11B is a vertical cross-sectional view of the first exemplary semiconductor structure along the vertical plane B-B' of FIG. 11A.

FIG. 11C is a vertical cross-sectional view of the first exemplary semiconductor structure along the vertical plane C-C' of FIG. 11A.

FIG. 12A is a top-down view of a second exemplary semiconductor structure after formation of a disposable gate structure according to a second embodiment of the present disclosure.

FIG. 12B is a vertical cross-sectional view of the second exemplary semiconductor structure along the vertical plane B-B' of FIG. 12A.

FIG. 12C is a vertical cross-sectional view of the second exemplary semiconductor structure along the vertical plane C-C' of FIG. 12A.

FIG. 12D is a vertical cross-sectional view of the second exemplary semiconductor structure along the vertical plane D-D' of FIG. 12A

FIG. 18A is a top-down view of a first variation of the second exemplary semiconductor structure after formation of a contact level dielectric layer and various contact via structures according to a third embodiment of the present disclosure.

FIG. 18B is a vertical cross-sectional view of the first variation of the second exemplary semiconductor structure along the vertical plane B-B' of FIG. 18A.

FIG. 18C is a vertical cross-sectional view of the first variation of the second exemplary semiconductor structure along the vertical plane C-C' of FIG. 18A.

FIG. 21A is a top-down view of a second variation of the third exemplary semiconductor structure after formation of a contact level dielectric layer and various contact via structures according to a third embodiment of the present disclosure.

FIG. 21B is a vertical cross-sectional view of the second variation of the third exemplary semiconductor structure along the vertical plane B-B' of FIG. 21A.

FIG. 21C is a vertical cross-sectional view of the second variation of the third exemplary semiconductor structure along the vertical plane C-C' of FIG. 21A.

DETAILED DESCRIPTION

Figure 1A:
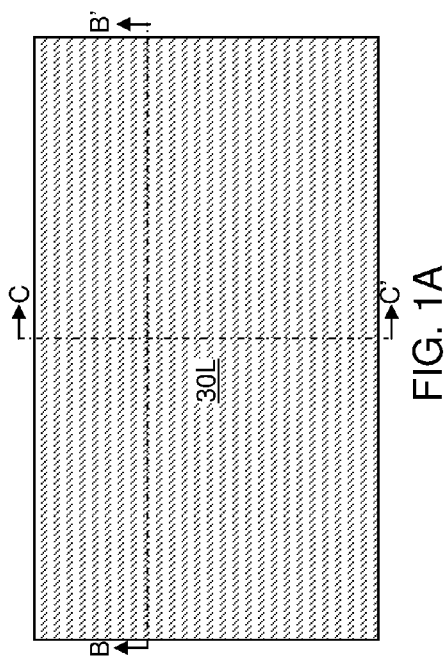
FIG. 1A is a top-down view of a first exemplary semiconductor structure including a semiconductor-on-insulator (SOI) substrate according to a first embodiment of the present disclosure.

As stated above, the present disclosure relates to a strained semiconductor nanowire, and a method of manufacturing the same. Aspects of the present disclosure are now described in detail with accompanying figures. It is noted that like reference numerals refer to like elements across different embodiments. The drawings are not necessarily drawn to scale.

Figure 1B:
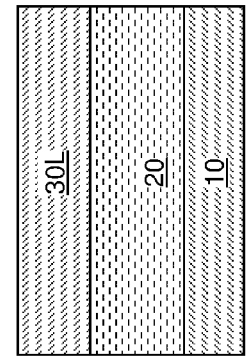
FIG. 1B is a vertical cross-sectional view of the first exemplary semiconductor structure along the vertical plane B-B' of FIG. 1A.
Figure 1C:
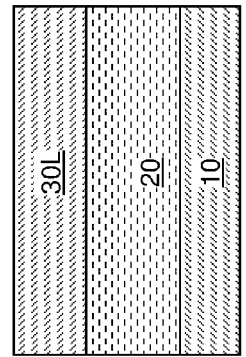
FIG. 1C is a vertical cross-sectional view of the first exemplary semiconductor structure along the vertical plane C-C' of FIG. 1A.

Referring to FIGS. 1A-1C, a first exemplary semiconductor structure according to a first embodiment of the present disclosure includes a semiconductor-on-insulator (SOI) substrate. The SOI substrate includes a handle substrate 10, an insulator layer 20, and a top semiconductor layer 30L. The insulator layer 20 is a buried insulator layer that is located between the handle substrate 10 and the top semiconductor layer 30L.

The handle substrate 10 can include a semiconductor material, an insulator material, a conductive material, or a combination thereof. The handle substrate 10 provides mechanical support to the insulator layer 20 and the top semiconductor layer 30L. The handle substrate 10 can have a thickness from 50 microns to 2 mm, although lesser and greater thicknesses can also be employed.

The insulator layer 20 includes a dielectric material such as silicon oxide, silicon nitride, silicon oxynitride, and/or a dielectric metal oxide. In one embodiment, the insulator layer 20 can be a silicon oxide layer. The thickness of the insulator layer 20 can be from 5 nm to 500 nm, although lesser and greater thicknesses can also be employed.

The top semiconductor layer 30L includes a semiconductor material, which can be a single crystalline material, a polycrystalline semiconductor material, or an amorphous semiconductor material. In one embodiment, the top semiconductor layer 30L includes a single crystalline semiconductor material such as a single crystalline elemental semiconductor material, a single crystalline semiconductor material of at least two elemental semiconductor materials, or a single crystalline compound semiconductor material. The thickness of the top semiconductor layer 30L can be from 5 nm to 500 nm, although lesser and greater thicknesses can also be employed.

Figure 2C:
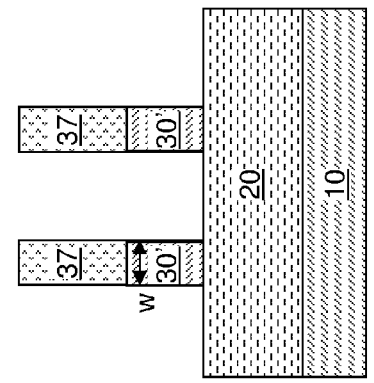
FIG. 2C is a vertical cross-sectional view of the first exemplary semiconductor structure along the vertical plane C-C' of FIG. 2A.
Figure 2A:
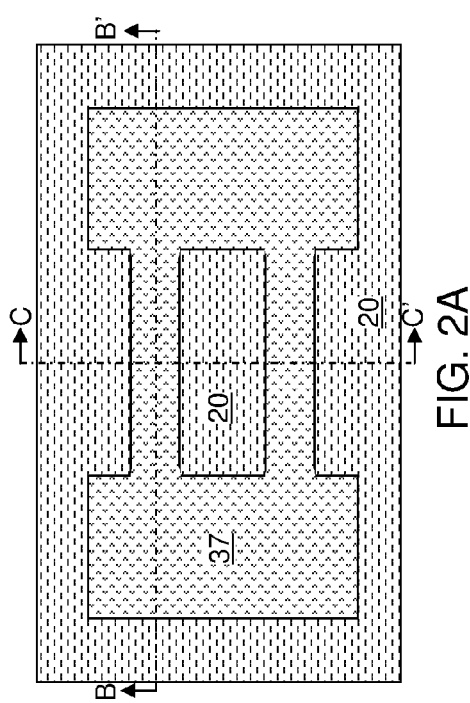
FIG. 2A is a top-down view of the first exemplary semiconductor structure including a fin-containing semiconductor portion according to the first embodiment of the present disclosure.
Figure 2B:
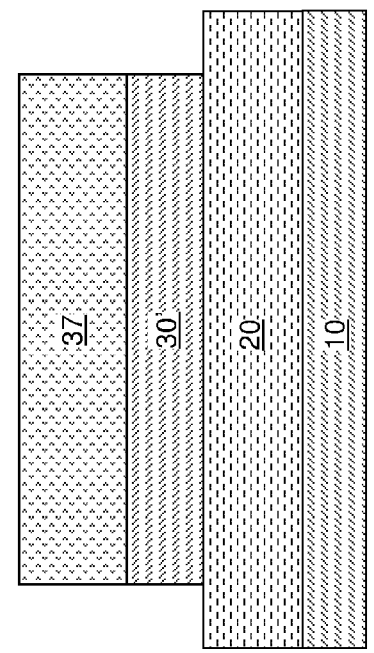
FIG. 2B is a vertical cross-sectional view of the first exemplary semiconductor structure along the vertical plane B-B' of FIG. 2A.

Referring to FIGS. 2A-2C, the top semiconductor layer 30L is patterned to form a fin-containing semiconductor portion 30'. Specifically, a photoresist layer 37 can be applied over the top surface of the top semiconductor layer 30L, and can be lithographically patterned so that remaining portions of the patterned photoresist layer 37 have a pair of pad shapes laterally connected by at least one elongated shape having a uniform width. The pattern in the photoresist layer 37 can be transferred into the top semiconductor layer 30L by an anisotropic etch, which removes physically exposed portions of the top semiconductor layer 30L.

The fin-containing semiconductor portion 30' is a remaining portion of the top semiconductor layer 30L after transferring the pattern in the photoresist layer 30 into the top semiconductor layer 30L. Each of the plurality of semiconductor fins can have a uniform width throughout. In one embodiment, each semiconductor fin can have a uniform width w between a pair of lengthwise sidewalls. As used herein, a width is uniform if the width is invariant under lateral translation. A "lengthwise" direction of a semiconductor fin refers to a horizontal direction along which the semiconductor fin 30 has a greatest lateral extent. A "lengthwise sidewall" refers to a sidewall that extends along the lengthwise direction of a semiconductor fin. The uniform width of each semiconductor fin can be from 5 nm to 300 nm, although lesser and greater dimensions can also be employed. The height of each semiconductor fin can be from 5 nm to 500 nm, although lesser and greater heights can also be employed. In one embodiment, the entirety of the fin-containing semiconductor portion 30' can be single crystalline. The photoresist layer 37 is subsequently removed, for example, by ashing.

Figure 3C:
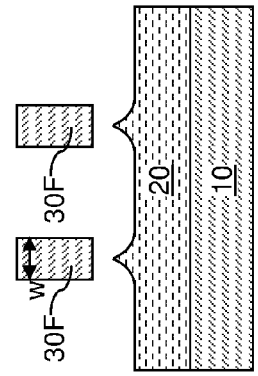
FIG. 3C is a vertical cross-sectional view of the first exemplary semiconductor structure along the vertical plane C-C' of FIG. 3A.
Figure 3A:
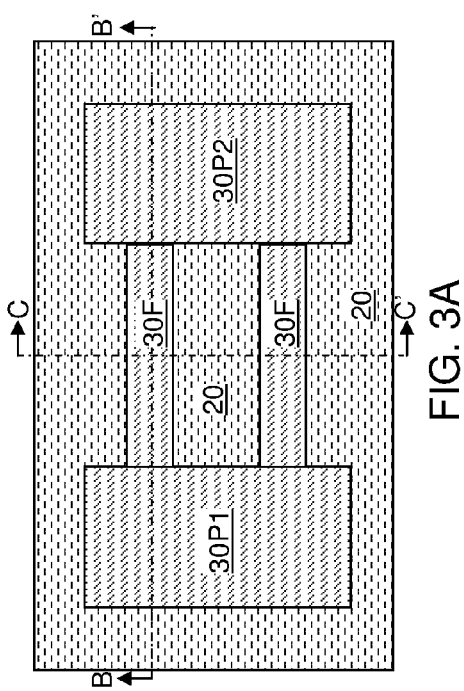
FIG. 3A is a top-down view of the first exemplary semiconductor structure after recessing physically exposed surfaces of an insulator layer according to the first embodiment of the present disclosure.
Figure 3B:
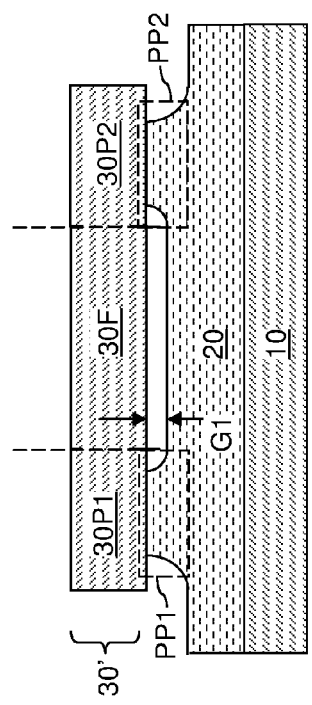
FIG. 3B is a vertical cross-sectional view of the first exemplary semiconductor structure along the vertical plane B-B' of FIG. 3A.

Referring to FIGS. 3A-3C, the fin-containing semiconductor portion 30' includes a plurality of semiconductor fins 30F, a first semiconductor pad portion 30P1 adjoined to a first end of each of the plurality of semiconductor fins 30F, and a second semiconductor pad portion 30P2 adjoined to a second end of each of the plurality of semiconductor fins 30F.

Two pedestal portions (PP1, PP2) are formed underneath the first and second semiconductor pad portions (30P1, 30P2) by isotropically etching surface portions of the insulator layer 20 employing the first and second semiconductor pad portions (30P1, 30P2) as an etch mask. The two pedestal portions (PP1, PP2) include a first pedestal portion PP1 formed underneath the first semiconductor pad portion 30P1 and a second pedestal portion PP2 formed underneath the second semiconductor pad portion 30P2. Thus, the insulator layer 20 includes two pedestal portions (PP1, PP2) underlying the first and second semiconductor pad portions (30P1, 30P2). The two pedestal portions (PP1, PP2) protrude above the top surface of the insulator layer 20 between the two pedestal portions (PP1, PP2).

Physically exposed surfaces of the insulator layer 20 are recessed employing the fin-containing semiconductor portion 30' as an etch mask. The recessing of the physically exposed top surfaces of the insulator layer 20 can be performed employing an etch chemistry that is selective to the semiconductor material of the fin-containing semiconductor portion 30'. For example, if the fin-containing semiconductor portion 30' includes silicon and the insulator layer 20 includes silicon oxide, a wet etch employing hydrofluoric acid can be employed to recess the physically exposed top surfaces of the insulator layer 20.

The etch that recesses the physically exposed top surfaces of the insulator layer 20 can be a wet etch or a dry etch. The recessing of the portions of the top surface of the insulator layer 20 underneath the fin-containing semiconductor portion 30' can be performed by isotropically etching physically exposed surfaces of the insulator layer 20 employing the fin-containing semiconductor portion 30' as an etch mask. In one embodiment, the etch that recesses the physically exposed top surfaces of the insulator layer 20 can be an isotropic wet etch or an isotropic dry etch.

A portion of the top surface of the insulator layer 20 is recessed underneath peripheral portions of the fin-containing semiconductor portion 30'. Each semiconductor fin 30F becomes vertically spaced from a recessed surface of the insulator layer 20. In one embodiment, the recessing of physically exposed portions of the top surface of the insulator layer 20 underneath the semiconductor fins 30F can form a ridge underneath each semiconductor fin 30F. As used herein, a ridge refers to a line at which two surfaces meet. The two surfaces that meet at each ridge underlying a semiconductor fin 30F are not vertical, are not horizontal, and are at an angle greater than 0 degrees and less than 90 degrees relative to a vertical line that is a surface normal of interfaces between the first and second semiconductor pad portions and remaining portions of the insulator layer 20. As used herein, a first element "underlies" a second element if the entirety of the first element is within an area of the second element as defined in a horizontal cross-sectional view, and is located underneath the first element. Thus, the top surface of the insulator layer 20 includes a ridge at which two angled surface portions of the top surface are adjoined to each other. The ridge can extend between the two pedestal portions (PP1, PP2).

Each semiconductor fin 30F can be a semiconductor nanowire. As used herein, a "semiconductor nanowire" refers to a semiconductor material portion having an elongated dimension along one direction and having dimensions not exceeding 1,000 nm along directions perpendicular to the elongated dimension. Each semiconductor fin 30F can have a pair of vertical sidewalls separated by a uniform width that is less than 1,000 nm, and can have a pair of a top surface and a bottom surface separated by a uniform vertical distance that is less than 1,000 nm, and can have a length that is greater than the width and the height. The fin-containing semiconductor portion 30' is a semiconductor material portion including a plurality of semiconductor nanowires.

Each ridge extends along the lengthwise direction of the plurality of semiconductor fins 30F. For each semiconductor fin 30F, the ridge that underlies the semiconductor fin 30F can be formed within a vertical plane that is located at the same lateral offset from each of two vertical planes including the pair of lengthwise sidewalls of the semiconductor fin 30F. In other words, the ridge can be equidistant from the vertical planes that include lengthwise sidewalls of the overlying semiconductor fin 30F.

The first semiconductor pad portion 30P1 and the second semiconductor pad portion 30P2 prevent etching of the insulator layer 20 underneath center portions of the first semiconductor pad portion 30P1 and the second semiconductor pad portion 30P2. A center portion of the first end portion and a center portion of the second end portion of each semiconductor fin 30 contact unrecessed portions of the top surface of the insulator layer 20.

Figure 4C:
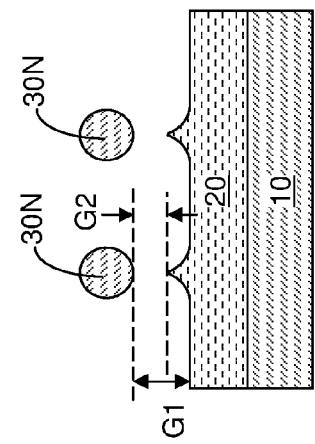
FIG. 4C is a vertical cross-sectional view of the first exemplary semiconductor structure along the vertical plane C-C' of FIG. 4A.
Figure 4A:
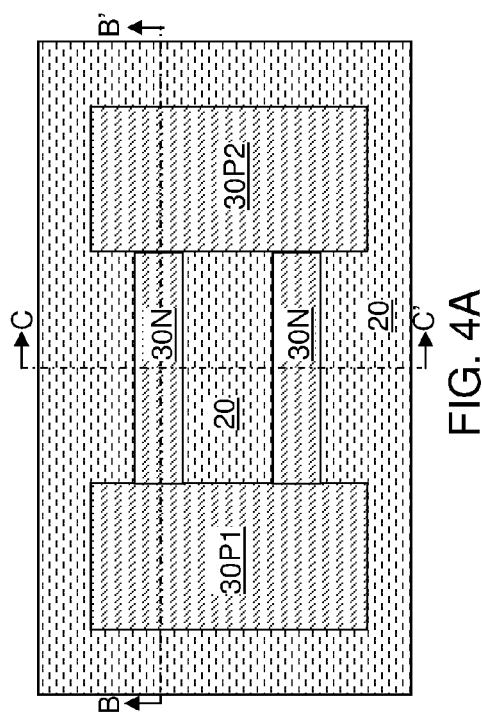
FIG. 4A is a top-down view of the first exemplary semiconductor structure after an anneal that converts semiconductor fins into semiconductor nanowires according to the first embodiment of the present disclosure.
Figure 4B:
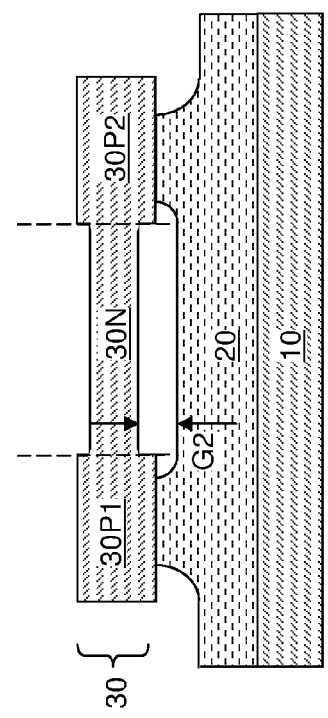
FIG. 4B is a vertical cross-sectional view of the first exemplary semiconductor structure along the vertical plane B-B' of FIG. 4A.

Referring to FIGS. 4A-4C, an optional annealing process can be performed to convert the plurality of semiconductor fins 30F into a plurality of semiconductor nanowires 30N having a rounded vertical cross-sectional shape within a vertical plane perpendicular to the lengthwise direction. In one embodiment, the rounded vertical cross-sectional shape can be a circular shape as illustrated in FIG. 4C. The rounding of the plurality of semiconductor fins 30F into a plurality of semiconductor nanowires 30N having a rounded cross-sectional shape can be performed, for example, by an anneal in a hydrogen ambient at an elevated temperature, which can be, for example, in a range from 800 degree Celsius to 1,100 degree Celsius.

The anneal process can form a semiconductor material portion 30 that includes a first semiconductor pad portion 30P1, a second semiconductor pad portion 30P2 laterally spaced from the first semiconductor pad portion 30P1, and a plurality of semiconductor nanowires 30N adjoined to sidewalls of the first and second semiconductor pad portions (30P1, 30P2) and suspended over the insulator layer 20. The semiconductor material portion 30 is a single contiguous structure, i.e., a contiguous semiconductor material portion.

The vertical distance between the bottom surfaces of the semiconductor nanowires 30N and an underlying ridge is herein referred to as a first gap distance G1. The vertical distance between the bottom surfaces of the semiconductor nanowires 30N and planar recessed portions of the top surface of the insulator layer 20 is herein referred to as a second gap distance G2. The second gap distance G2 is greater than the first gap distance G1.

Figure 5A:
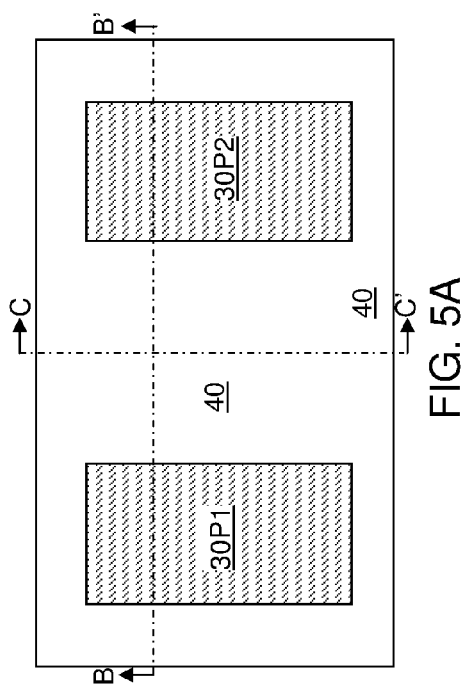
FIG. 5A is a top-down view of the first exemplary semiconductor structure after deposition of a planarization material layer according to the first embodiment of the present disclosure.
Figure 5C:
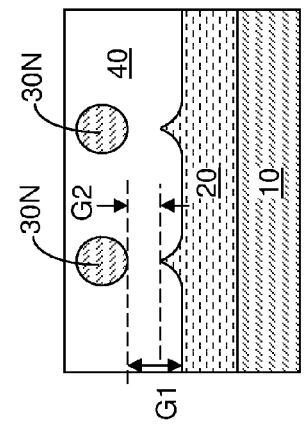
FIG. 5C is a vertical cross-sectional view of the first exemplary semiconductor structure along the vertical plane C-C' of FIG. 5A.
Figure 5B:
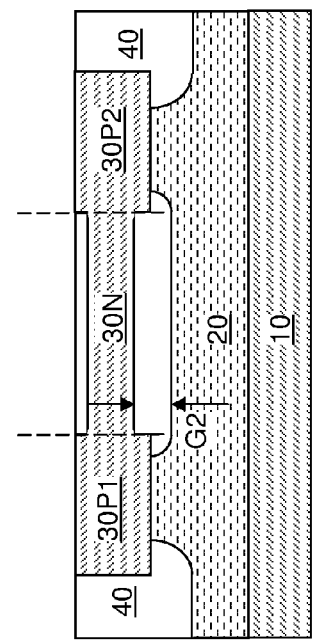
FIG. 5B is a vertical cross-sectional view of the first exemplary semiconductor structure along the vertical plane B-B' of FIG. 5A.

Referring to FIGS. 5A and 5B, a planarization material layer 40 is deposited conformally over the insulator layer 20 and the semiconductor material portion (30P1, 30P2, 30N). For example, a planarizable dielectric material that is different from the dielectric material of the insulator layer 20 is conformally deposited, and is subsequently planarized employing the top surfaces of the first and second semiconductor pad portions (30P1, 30P2) as a stopping surface. The remaining planarized portion of the deposited dielectric material is the planarization material layer 40.

The planarization material layer 40 can include a dielectric material such a borosilicate glass (BSG), borophosphosilicate glass (BPSG), fluorosilicate glass (FSG), a porous or non-porous organosilicate glass (OSG), or silicon nitride. The material of the planarization material layer 40 is a temporary fill material, i.e., a disposable fill material that is subsequently removed. In one embodiment, the topmost surfaces of the semiconductor nanowires 30N can be located bellowed the plane of the top surface of the planarization material layer 40.

Figure 6C:
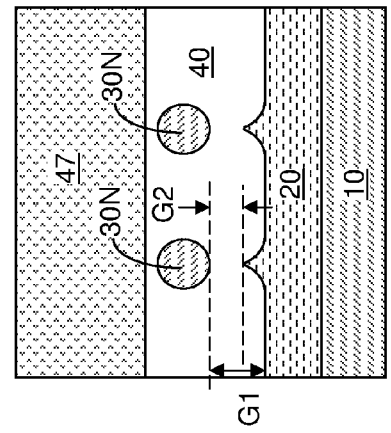
FIG. 6C is a vertical cross-sectional view of the first exemplary semiconductor structure along the vertical plane C-C' of FIG. 6A.
Figure 6A:
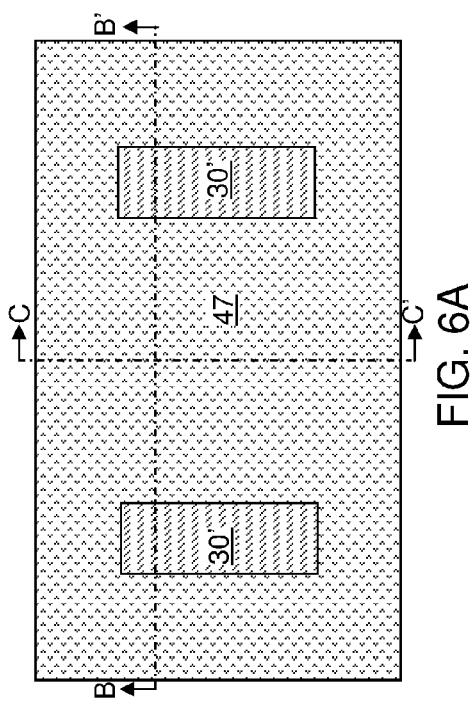
FIG. 6A is a top-down view of the first exemplary semiconductor structure after formation of trenches within semiconductor pad portions according to the first embodiment of the present disclosure.
Figure 6B:
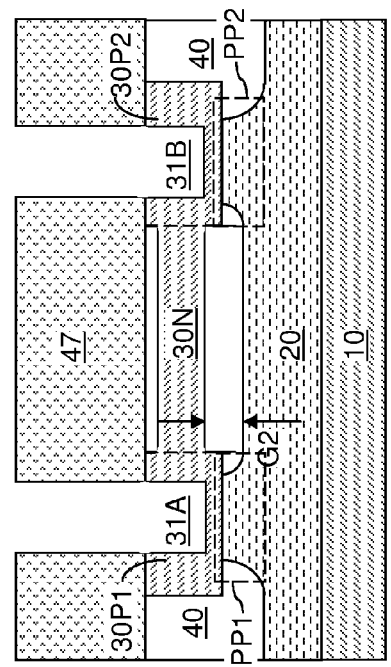
FIG. 6B is a vertical cross-sectional view of the first exemplary semiconductor structure along the vertical plane B-B' of FIG. 6A.

Referring to FIGS. 6A-6C, a photoresist layer 47 is applied over the planarization material layer 40 and the semiconductor material portion (30P1, 30P2, 30N), and is lithographically patterned to form two openings that overlie the first and second semiconductor pad portions (30P1, 30P2). The peripheries of the two openings in the photoresist layer 47 is laterally offset inward from the peripheries of the first and second semiconductor pad portions (30P1, 30P2).

A first trench 31A is formed within the first semiconductor pad portion 30P1, and a second trench 31B is formed within the second semiconductor pad portion 30P2 by etching materials of the first and second semiconductor pad portions (30P1, 30P2) employing the patterned photoresist layer 47 as an etch mask. In one embodiment, the first trench 31A and the second trench 31B can have substantially vertical sidewalls. In one embodiment, the bottom surfaces of the first trench 31A and the second trench 31B can be located above the plane including the interfaces between the first and second pedestal portions (PP1, PP2) of the insulator layer 20 and the first and second semiconductor pad portions (30P1, 30P2). The photoresist layer 47 is subsequently removed, for example, by ashing.

Figure 7A:
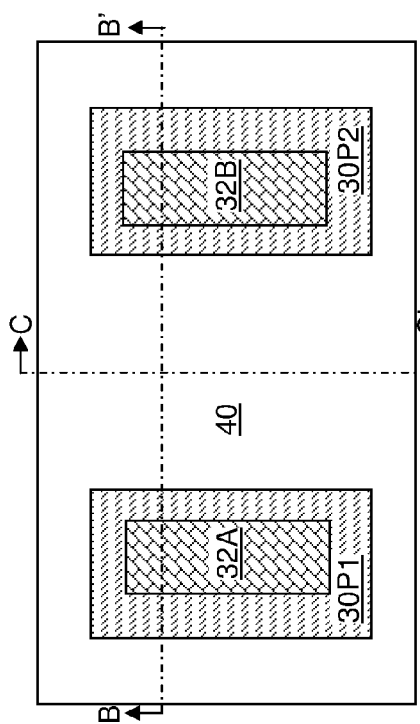
FIG. 7A is a top-down view of the first exemplary semiconductor structure after filling trenches with a stress-generating material according to the first embodiment of the present disclosure.
Figure 7C:
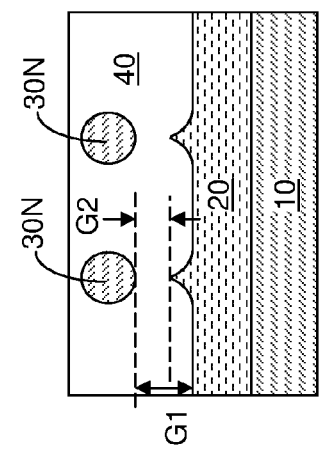
FIG. 7C is a vertical cross-sectional view of the first exemplary semiconductor structure along the vertical plane C-C' of FIG. 7A.
Figure 7B:
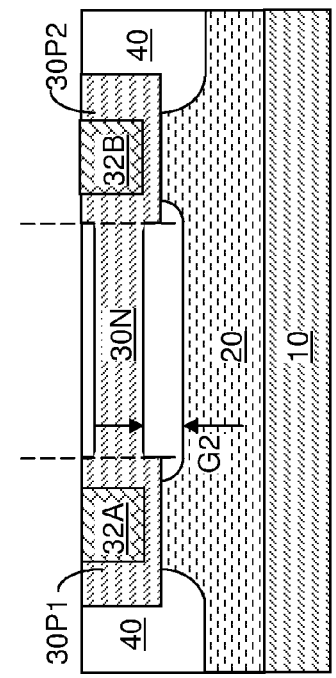
FIG. 7B is a vertical cross-sectional view of the first exemplary semiconductor structure along the vertical plane B-B' of FIG. 7A.
Figure 8A:
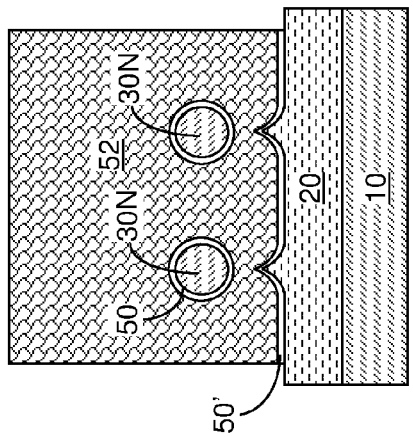
FIG. 8A is a top-down view of the first exemplary semiconductor structure after removal of the planarization material layer and formation of a gate structure according to the first embodiment of the present disclosure.
Figure 8C:
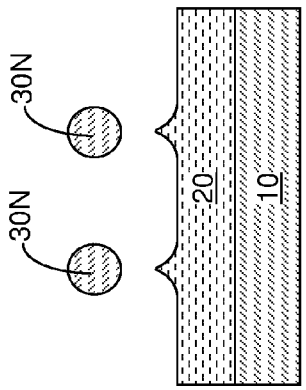
FIG. 8C is a vertical cross-sectional view of the first exemplary semiconductor structure along the vertical plane C-C' of FIG. 8A.
Figure 8B:
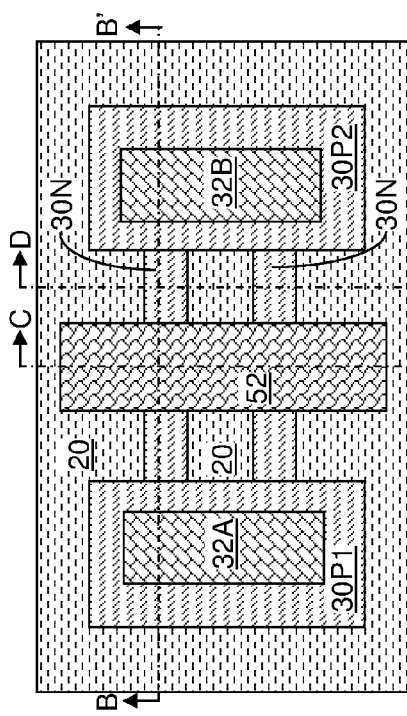
FIG. 8B is a vertical cross-sectional view of the first exemplary semiconductor structure along the vertical plane B-B' of FIG. 8A.
Figure 8D:
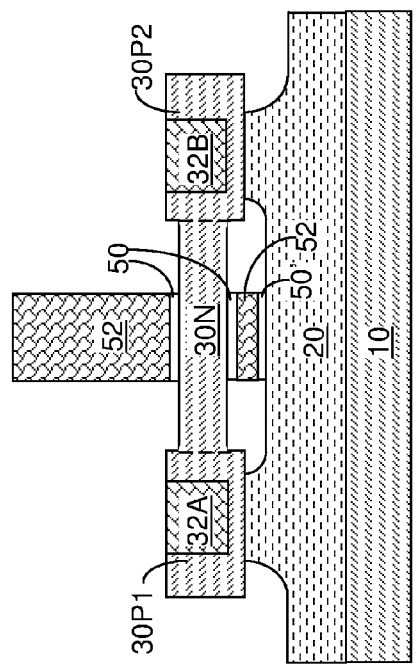
FIG. 8D is a vertical cross-sectional view of the first exemplary semiconductor structure along the vertical plane D-D' of FIG. 8A.
Figure 9A:
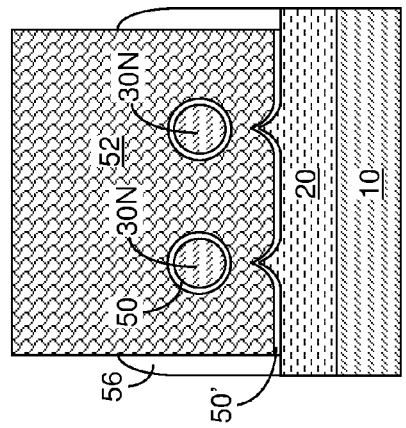
FIG. 9A is a top-down view of the first exemplary semiconductor structure after formation of a dielectric spacer according to the first embodiment of the present disclosure.
Figure 9C:
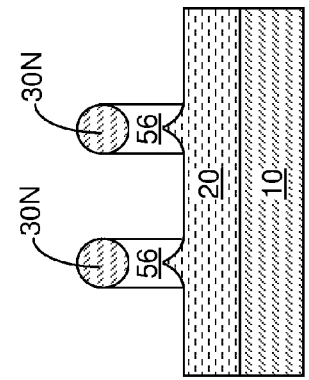
FIG. 9C is a vertical cross-sectional view of the first exemplary semiconductor structure along the vertical plane C-C' of FIG. 9A.
Figure 9B:
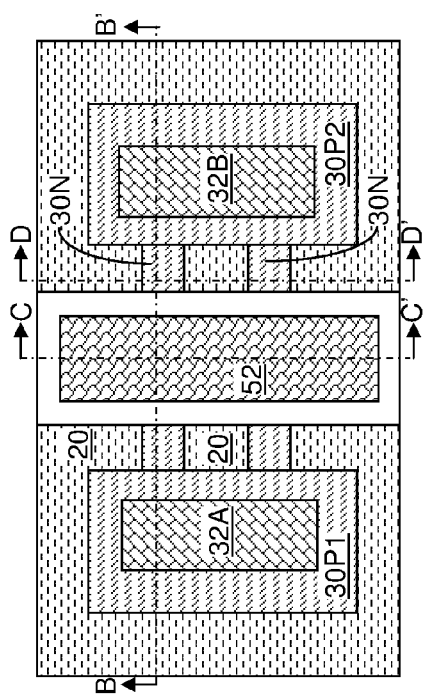
FIG. 9B is a vertical cross-sectional view of the first exemplary semiconductor structure along the vertical plane B-B' of FIG. 9A.
Figure 9D:
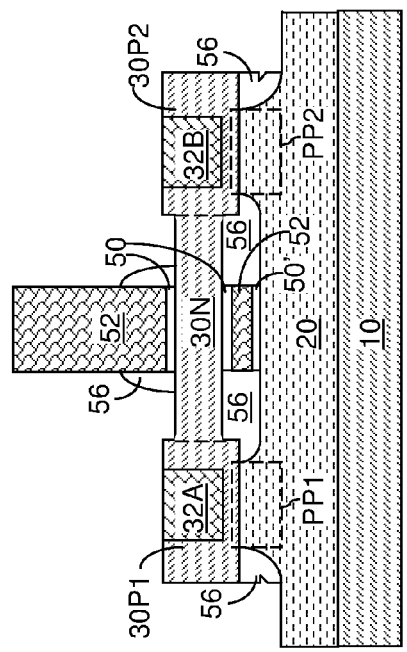
FIG. 9D is a vertical cross-sectional view of the first exemplary semiconductor structure along the vertical plane D-D' of FIG. 9A.
Figure 10C:
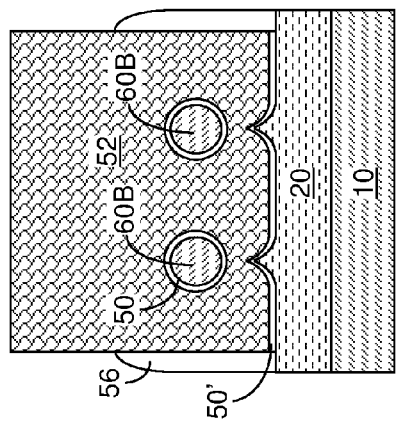
FIG. 10C is a vertical cross-sectional view of the first exemplary semiconductor structure along the vertical plane C-C' of FIG. 10A.
Figure 10D:
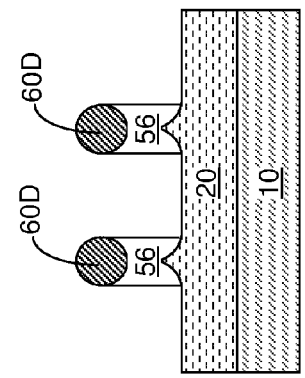
FIG. 10D is a vertical cross-sectional view of the first exemplary semiconductor structure along the vertical plane D-D' of FIG. 10A.
Figure 10A:
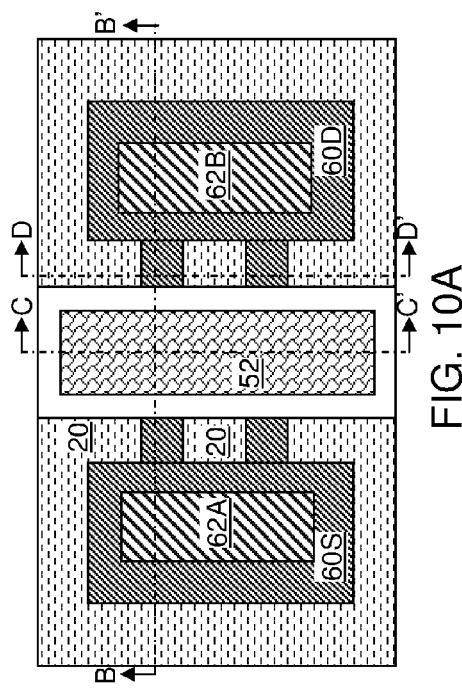
FIG. 10A is a top-down view of the first exemplary semiconductor structure after formation of a source region and a drain region according to the first embodiment of the present disclosure.
Figure 10B:
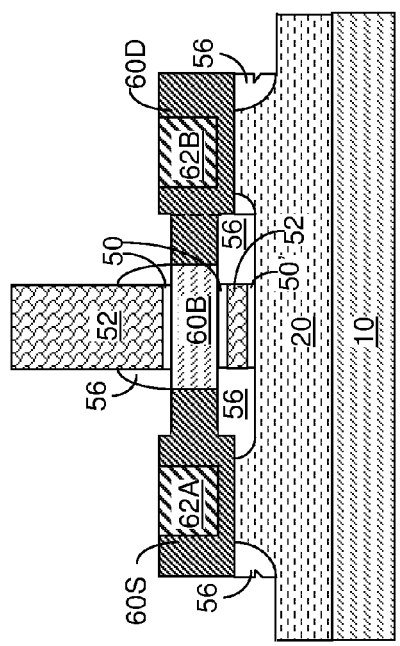
FIG. 10B is a vertical cross-sectional view of the first exemplary semiconductor structure along the vertical plane B-B' of FIG. 10A.

Referring to FIGS. 7A-7C, the first and second trenches (31A, 31B; See FIGS. 6A-6C) are filled with a stress-generating material. In one embodiment, the first and second semiconductor pad portions (30P1, 30P2) can include a single crystalline semiconductor material, and the stress-generating material can be a single crystalline material that is epitaxially aligned to the single crystalline semiconductor material of the first and second semiconductor pad portions (30P1, 30P2). Excess portions of the deposited single crystalline material can be removed from above the horizontal plane including the topmost surfaces of the first and second semiconductor pad portions (30P1, 30P2) by a planarization process, which can be, for example, chemical mechanical planarization. The remaining portions of the deposited single crystalline material within the first and second trenches (31A, 31B; See FIGS. 6A-6C) are herein referred to as a first stress-generating material portion 32A and a second stress-generating material portion 32B, respectively.

The first stress-generating material portion 32A is embedded in the first trench within the first semiconductor pad portion 30P1, and the second stress-generating material portion 32B is embedded in the second trench within the second semiconductor pad portion 30P2. The semiconductor nanowires 30N can be strained along the lengthwise direction by a stress generated by the first and second stress-generating material portions (30P1, 30P2).

The first and second semiconductor pad portions (30P1, 30P2) can include a first single crystalline semiconductor material, and the first and second stress-generating material portions (32A, 32B) can include a second single crystalline semiconductor material that is epitaxially aligned to the first single crystalline semiconductor material. The epitaxial alignment of the second single crystalline semiconductor material to the first single crystalline semiconductor material can be provided by depositing the second single crystalline semiconductor material employing an epitaxial deposition process. Various epitaxial deposition processes for single crystalline semiconductor materials are known in the art.

In one embodiment, the first single crystalline semiconductor material and the second single crystalline semiconductor material can be selected such that the first and second single crystalline semiconductor materials have a same crystal structure and the second single crystalline semiconductor material has a smaller lattice constant than the first single crystalline semiconductor material. For example, the first single crystalline semiconductor material can be silicon, and the second single crystalline semiconductor material can be a silicon-carbon alloy. Alternately, the first single crystalline semiconductor material can be a silicon-germanium alloy, and the second single crystalline semiconductor material can be silicon or another silicon-germanium alloy having a lesser concentration of germanium. Yet alternately, the first and second single crystalline semiconductor materials can be compound semiconductor materials provided that the second single crystalline semiconductor material has a smaller lattice constant than the first single crystalline semiconductor material and that the second single crystalline semiconductor material can be deposited on the first single crystalline semiconductor material with epitaxial alignment. In such cases, the first and second stress-generating material portions (32A, 32B) can apply a tensile stress to the semiconductor nanowires 30N along the lengthwise direction of the semiconductor nanowires 30N. Consequently, the semiconductor nanowires 30N become strained along the lengthwise direction with a tensile strain upon filling of the trenches with the stress-generating material. In one embodiment, the magnitude of the tensile stress applied to the semiconductor nanowires 30N to generate a tensile strain in the semiconductor nanowires 30N can be in a range from 0.1 GPa to 15 GPa, although lesser and greater tensile stress can also be generated.

In another embodiment, the first single crystalline semiconductor material and the second single crystalline semiconductor material can be selected such that the first and second single crystalline semiconductor materials have a same crystal structure and the second single crystalline semiconductor material has a greater lattice constant than the first single crystalline semiconductor material. For example, the first single crystalline semiconductor material can be silicon, and the second single crystalline semiconductor material can be a silicon-germanium alloy. Alternately, the first single crystalline semiconductor material can be a silicon-carbon alloy, and the second single crystalline semiconductor material can be silicon or a silicon-germanium alloy having a lesser concentration of germanium. Yet alternately, the first and second single crystalline semiconductor materials can be compound semiconductor materials provided that the second single crystalline semiconductor material has a greater lattice constant than the first single crystalline semiconductor material and that the second single crystalline semiconductor material can be deposited on the first single crystalline semiconductor material with epitaxial alignment. In such cases, the first and second stress-generating material portions (32A, 32B) can apply a compressive stress to the semiconductor nanowires 30N along the lengthwise direction of the semiconductor nanowires 30N. Consequently, the semiconductor nanowires 30N become strained along the lengthwise direction with a compressive strain upon filling of the trenches with the stress-generating material. In one embodiment, the magnitude of the compressive stress applied to the semiconductor nanowires 30N to generate a compressive strain in the semiconductor nanowires 30N can be in a range from 0.1 GPa to 3 GPa, although lesser and greater compressive stress can also be generated provided that the semiconductor nanowires 30N do not buckle upon subsequent removal of the planarization material layer 40.

Referring to FIGS. 8A-8D, the planarization material layer 40 is removed selective to the semiconductor material portion (30P1, 30P2, 30N) and the first and second stress-generating material portions (32A, 32B) employing an etch process. In one embodiment, the etch process employed to remove the planarization material layer 40 can be at least partially selective to the material of the insulator layer 20. As used herein, an etch process that etches a first material is selective to a second material if the removal rate of the second material during the etch process is less than 1/10 of the removal rate of the first material during the etch process. As used herein, an etch process that etches a first material is partially selective to a second material if the removal rate of the second material during the etch process is not less than 1/10 and less than 1/2 of the removal rate of the first material during the etch process.

A gate structure (50, 52, 50') is formed across the semiconductor nanowires 30N, for example, by depositing a stack of a gate dielectric layer and a gate conductor layer, applying and patterning a photoresist layer over the gate conductor layer, and transferring the pattern in the photoresist layer into the gate conductor layer and the gate dielectric layer.

The gate dielectric layer can include a dielectric oxide and/or a dielectric nitride of a semiconductor material (such as silicon oxide and/or silicon nitride), and/or can include a dielectric metal oxide or a dielectric metal nitride (such as $HfO_2$, $ZrO_2$, $HfO_xN_y$, $ZrO_xN_y$) or any other high dielectric constant (high-k) gate dielectric material having a dielectric constant greater than 7.9 as known in the art. The gate dielectric layer can be formed by thermal and/or plasma oxidation, thermal and/or plasma nitridation, atomic layer deposition (ALD), chemical vapor deposition (CVD), or a combination thereof. The thickness of the gate dielectric layer can be less than ½ of the second gap distance G2 (See FIG. 4C), and can be from 1 nm to 6 nm, although lesser and greater thicknesses can also be employed. The gate conductor layer includes at least one conductive material, which can be at least one doped semiconductor material and/or at least one metallic material.

Physically exposed portions of the gate conductor layer and the gate dielectric layer are removed during an etch process that employs the patterned photoresist layer as an etch mask. A combination of an anisotropic etch and an isotropic etch can be employed to remove stringers from underneath end portions of the semiconductor nanowires 30N. Remaining portions of the gate conductor layer constitutes a gate electrode 52, and remaining portions of the gate dielectric layer constitutes the gate dielectric 50 and a gate dielectric material portion 50'. The gate dielectric material portion 50' has the same thickness and composition as the gate dielectric 50, and contacts the top surface of the insulator layer 20. The gate structure (50, 52, 50') includes a combination of the gate dielectric 50, the gate electrode 52, and the gate dielectric material portion 50'. The gate dielectric 50 laterally surrounding a portion of each semiconductor nanowire 30N, and the gate electrode 52 contacts the gate dielectric 50. A portion of the gate electrode 52 underlies the semiconductor nanowires 30N. The gate dielectric material portion 50' can contact the top surface of the insulator layer 20.

Referring to FIGS. 9A-9D, a dielectric spacer 56 can be formed by depositing a conformal dielectric material layer on the semiconductor material portion (30P1, 30P2, 30N), the first and second stress-generating material portions (32A, 32B), and the gate electrode 52, and anisotropically etching the conformal dielectric material layer. Remaining portions of the conformal dielectric material layer constitute the dielectric spacer 56. The dielectric spacer 56 includes a first dielectric spacer portion laterally surrounding the gate electrode 52, a second dielectric spacer portions that laterally surrounds one of the two pedestal portions (PP1, PP2), and a third dielectric spacer portion laterally surrounding another of the two pedestal portions (PP1, PP2). The entirety of the dielectric spacer 56 is formed as a single contiguous structure, and the second dielectric spacer portion and the third dielectric spacer portion are connected to the first dielectric spacer portion by additional dielectric spacer portions that underlies the semiconductor nanowires 40N. The dielectric spacer 56 includes a dielectric material, which can be silicon oxide, silicon nitride, porous or non-porous organosilicate glass (OSG), or a combination thereof.

Referring to FIGS. 10A-10D, a source region (60S, 62A) and a drain region (60D, 62B) can be formed by ion implantation employing the combination of the gate electrode 52 and the dielectric spacer 56 as an implantation mask. If the semiconductor material portion (30P1, 30P2, 30N; See FIGS. 9A-9D) includes a first single crystalline semiconductor material and the first and second stress-generating material portions (32A, 32B; See FIGS. 9A-9D) include a second single crystalline semiconductor material, the source region (60S, 62A) can include a first semiconductor material source portion 60S and a second semiconductor material source portion 62A, and the drain region (60D, 62B) can include a first semiconductor material drain portion 60D and a second semiconductor material drain portion 62B. The first semiconductor material source portion 60S includes the entirety of regions of the first semiconductor pad portion 30P1 (See FIGS. 9A and 9C) and end portions of the semiconductor nanowires 30N (See FIGS. 9A and 9C). The first semiconductor material drain region 60D includes the entirety of regions of the second semiconductor pad portion 30P2 (See FIGS. 9A and 9C) and other end portions of the semiconductor nanowires 30N (See FIGS. 9A and 9C). The second semiconductor material source region 62A includes the same region as the first stress-generating material portion 32A, and the second semiconductor material drain region 62B includes the same region as the second stress-generating material portion 32B. The second semiconductor material source region 62A and the second semiconductor material drain region 62B are stress-generating material portions that are epitaxially aligned to the semiconductor material of the semiconductor material portion (60S, 60D, 60B).

The unimplanted portion of each semiconductor fin 30 is a body region 60B. The body regions 60B can be undoped or doped. If the body regions 60B are doped with dopants of a first conductivity type, the source region (60S, 62A) and the drain region (60D, 62B) can be doped with dopants of a second conductivity type, which is the opposite of the first conductivity type.

Each semiconductor fin (30S, 30B, 30D) includes a body region 30B located in the semiconductor fin (30S, 30B, 30D) and laterally surrounded by the gate dielectric 50, and a source region 30S and a drain region 30D that laterally contact the body region 30B at two laterally spaced interfaces within the semiconductor fin (30S, 30B, 30D).

While an embodiment in which ion implantation of dopants to form the source region (60S, 62A) and the drain region (60D, 62B) is performed after formation of the dielectric spacer 56, embodiments in which the ion implantation is performed prior to formation of the dielectric spacer 56 are also contemplated herein. Further, multiple ion implantation processes can be employed prior to, and/or after, formation of the dielectric spacer 56 to form the source region (60S, 62A) and the drain region (60D, 62B).

Optionally, a raised source region (not shown) and/or a raised drain region (not shown) can be performed by selective epitaxy of another doped semiconductor material directly on the surfaces of the source region (60S, 62A) and the drain region (60D, 62B).

Referring to FIGS. 11A-11C, a contact level dielectric layer 90 is deposited over the semiconductor material portion (60S, 62A, 60D), the second semiconductor material source region 62A, the second semiconductor material drain region 62B, the gate electrode 52, and the dielectric spacer 56. The contact level dielectric layer 90 includes a dielectric material such as undoped silicon oxide, doped silicon oxide, silicon nitride, porous or non-porous organosilicate glass (OSG), or a combination thereof. The contact level dielectric layer 90 can be planarized to form a planar top surface.

Various contact via structures (92S, 92D, 92G) can be formed through the contact level dielectric layer 90. The various contact via structures (92S, 92D, 92G) can include, for example, a source-side contact via structure 92S, a drain-side contact via structure 92D, and a gate-side contact via structure 92G. The source-side contact via structure 92S can contact the source region (60S, 62A), the drain-side contact via structure 92D can contact the drain region (60D, 62B), and the gate-side contact via structure 92G can contact the gate electrode 52.

Referring to FIGS. 12A-12C, a second exemplary semiconductor structure according to a second embodiment of the present disclosure can be derived from the first exemplary semiconductor structure of FIGS. 7A-7C by removing the planarization material layer 40 in the same manner as in the first embodiment, and by forming a disposable gate structure 152 in lieu of the gate structure (50, 52, 50'). The disposable gate structure 152 can be formed by depositing a disposable gate material layer and patterning the disposable gate material layer. The disposable gate material layer can include a dielectric material such as amorphous carbon, or a semiconductor material that is different from the semiconductor materials of the semiconductor material portion (30P1, 30P2, 30N) and the first and second stress-generating material portions (32A, 32B). In one embodiment, the disposable gate material layer can include germanium or a silicon-germanium alloy having an atomic concentration of germanium greater than 50%.

The patterning of the disposable gate material layer can be performed by applying and patterning a photoresist layer over the disposable gate material layer, and transferring the pattern in the photoresist layer into the disposable gate material layer in an etch process. The etch process can include a combination of an anisotropic etch and an isotropic etch. The remaining portion of the disposable gate material layer constitutes the disposable gate structure 152.

Figure 13A:
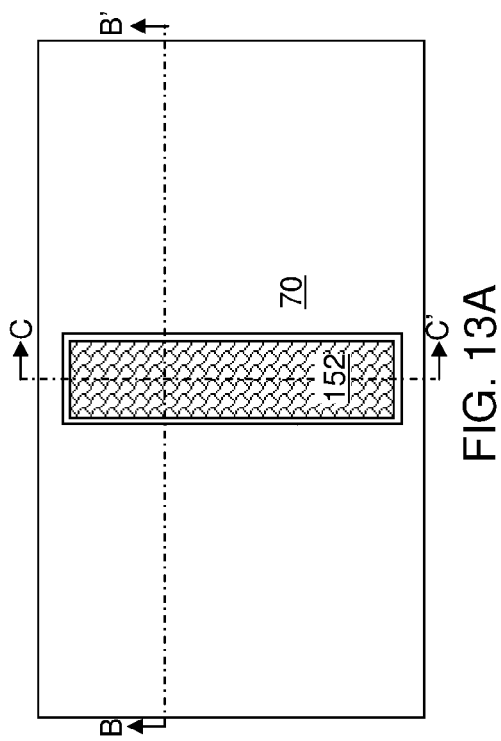
FIG. 13A is a top-down view of the second exemplary semiconductor structure after formation of a planarization dielectric layer and replacement of the disposable gate structure with a replacement gate structure according to the second embodiment of the present disclosure.
Figure 13C:
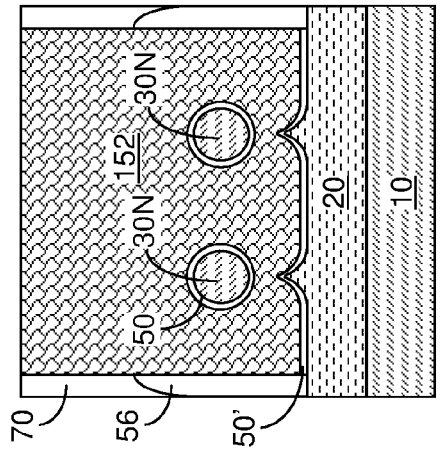
FIG. 13C is a vertical cross-sectional view of the second exemplary semiconductor structure along the vertical plane C-C' of FIG. 13A.
Figure 13B:
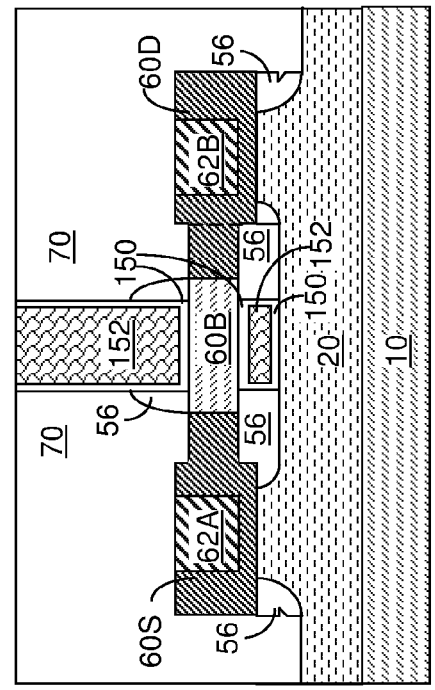
FIG. 13B is a vertical cross-sectional view of the second exemplary semiconductor structure along the vertical plane B-B' of FIG. 13A.

Referring to FIGS. 13A-13C, the processing steps of FIGS. 9A-9D and FIGS. 10A-10D are performed as in the first embodiment. A gate level dielectric layer 70 is formed above the semiconductor material portion (30P1, 30P2, 30N), the first and second stress-generating material portions (32A, 32B), and the disposable gate structure 152 (See FIGS. 12A-12C), and is subsequently planarized employing the disposable gate structure 152 as a stopping structure. The gate level dielectric layer 70 includes a dielectric material such as silicon oxide and/or silicon nitride.

The disposable gate structure 152 is removed selective to the gate level dielectric layer 70 and the semiconductor material of the body regions 60B to form a gate cavity. A gate dielectric 150 and a gate electrode 152 are subsequently formed by depositing a gate dielectric layer and a gate conductor layer within the gate cavity. Excess portions of the gate dielectric layer and the gate conductor layer are removed from above the top surface of the gate level dielectric layer 70, for example, by planarization. A remaining portion of the gate dielectric layer constitutes the gate dielectric 150, and a remaining portion of the gate conductor layer constitutes the gate electrode 152. The gate dielectric 150 of the second embodiment may have the same composition as the gate dielectric 50 of the first embodiment. The gate electrode 152 of the second embodiment may have the same composition as the gate dielectric 150 of the first embodiment.

Figure 14A:
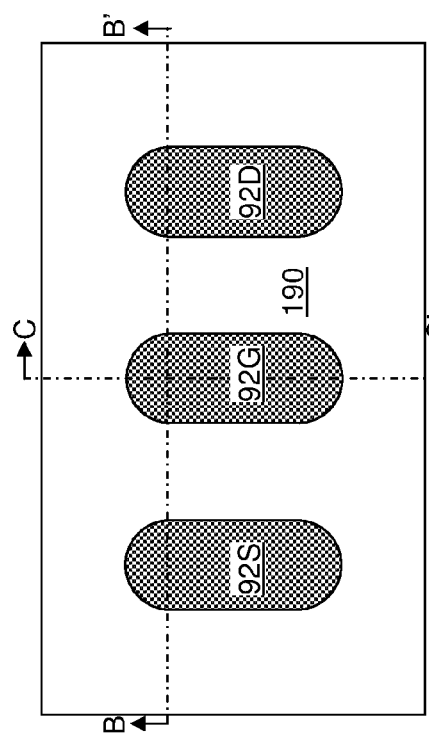
FIG. 14A is a top-down view of the second exemplary semiconductor structure after formation of a contact level dielectric layer and various contact via structures according to the second embodiment of the present disclosure.
Figure 14C:
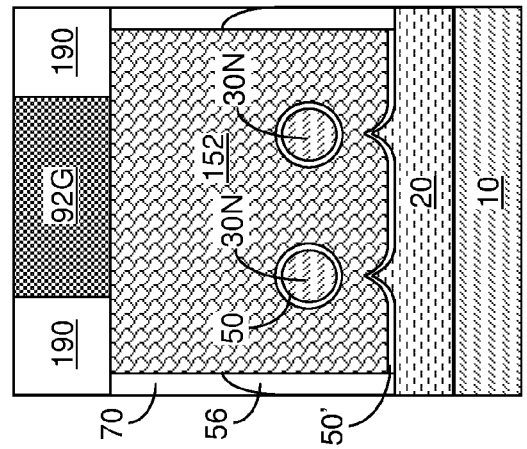
FIG. 14C is a vertical cross-sectional view of the second exemplary semiconductor structure along the vertical plane C-C' of FIG. 14A.
Figure 14B:
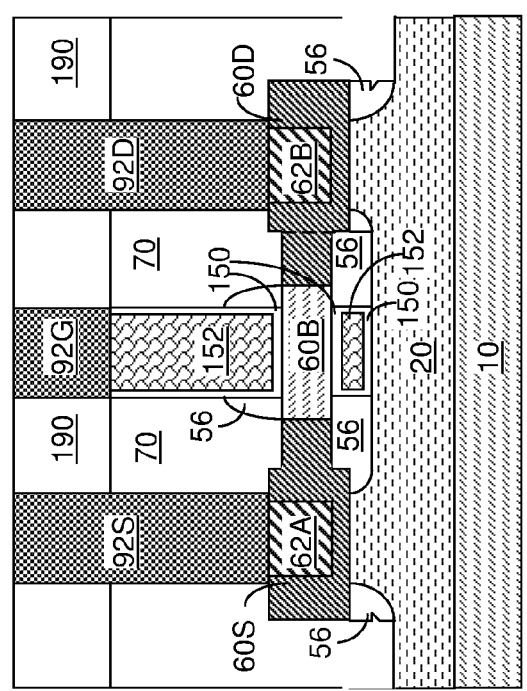
FIG. 14B is a vertical cross-sectional view of the second exemplary semiconductor structure along the vertical plane B-B' of FIG. 14A.

Referring to FIGS. 14A-14C, a contact level dielectric layer 190 is deposited over the gate level dielectric layer 70. The contact level dielectric layer 190 includes a dielectric material such as undoped silicon oxide, doped silicon oxide, silicon nitride, porous or non-porous organosilicate glass (OSG), or a combination thereof. The contact level dielectric layer 190 can be planarized to form a planar top surface.

Various contact via structures (92S, 92D, 92G) can be formed through the contact level dielectric layer 190 and optionally through the gate level dielectric layer 70. The various contact via structures (92S, 92D, 92G) can include, for example, a source-side contact via structure 92S, a drain-side contact via structure 92D, and a gate-side contact via structure 92G. The source-side contact via structure 92S can contact the source region (60S, 62A), the drain-side contact via structure 92D can contact the drain region (60D, 62B), and the gate-side contact via structure 92G can contact the gate electrode 52.

Figure 15C:
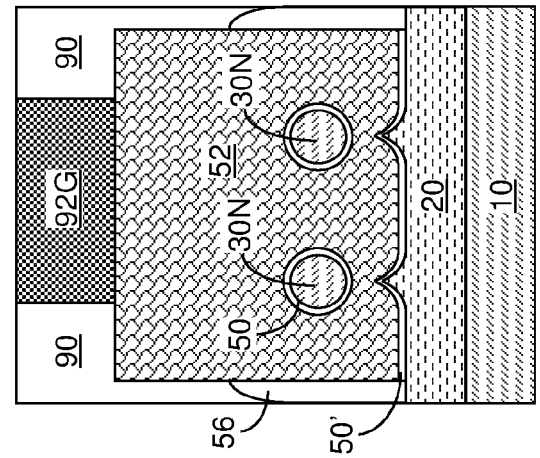
FIG. 15C is a vertical cross-sectional view of the third exemplary semiconductor structure along the vertical plane C-C' of FIG. 15A.
Figure 15A:
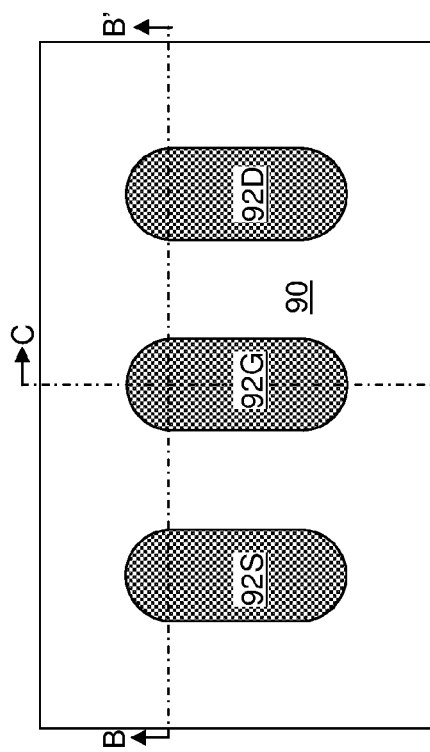
FIG. 15A is a top-down view of a third exemplary semiconductor structure after formation of a contact level dielectric layer and various contact via structures according to a third embodiment of the present disclosure.
Figure 15B:
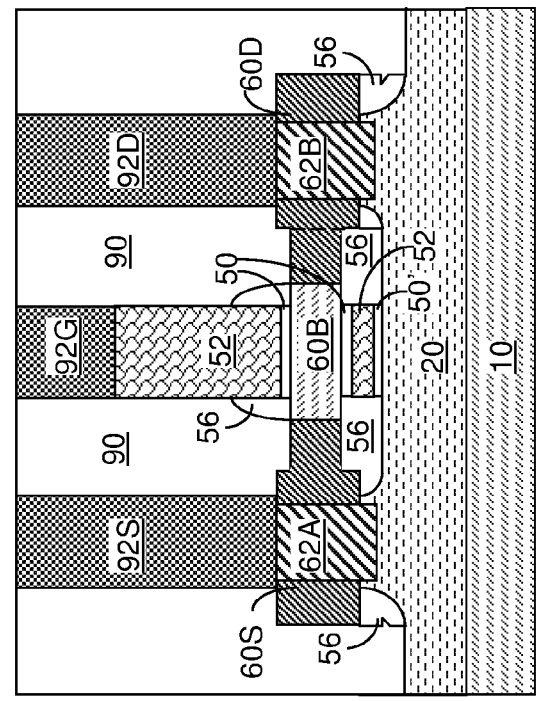
FIG. 15B is a vertical cross-sectional view of the third exemplary semiconductor structure along the vertical plane B-B' of FIG. 15A.

Referring to FIGS. 15A-15C, a third exemplary semiconductor structure according to a third embodiment of the present disclosure can be derived from the first exemplary semiconductor structure or the third exemplary semiconductor structure by causing the first trench 31A and the second trench 31B at the processing steps of FIGS. 6A-6C to extend into the first and second pedestal portions (PP1, PP2). Consequently, the second semiconductor material source region 62A and the second semiconductor material drain region 62B can extend into the first and second pedestal portions (PP1, PP2) of the insulator layer 20, respectively.

Figure 16A:
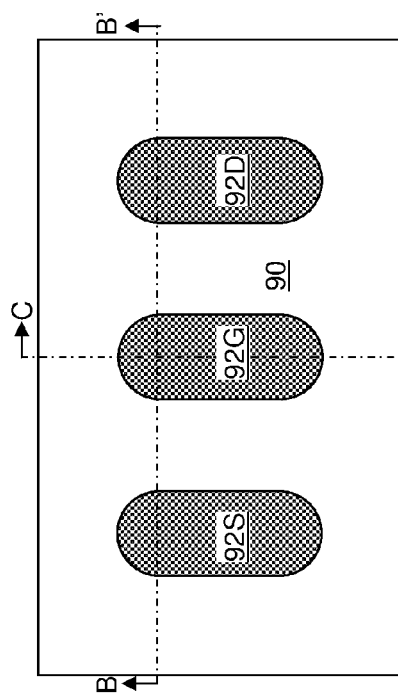
FIG. 16A is a top-down view of a first variation of the first exemplary semiconductor structure after formation of a contact level dielectric layer and various contact via structures according to a third embodiment of the present disclosure.
Figure 16C:
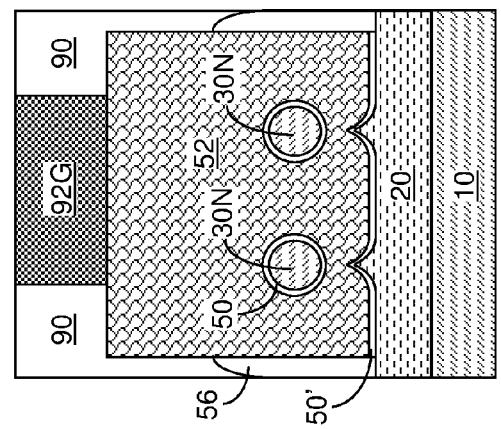
FIG. 16C is a vertical cross-sectional view of the first variation of the first exemplary semiconductor structure along the vertical plane C-C' of FIG. 16A.
Figure 16B:
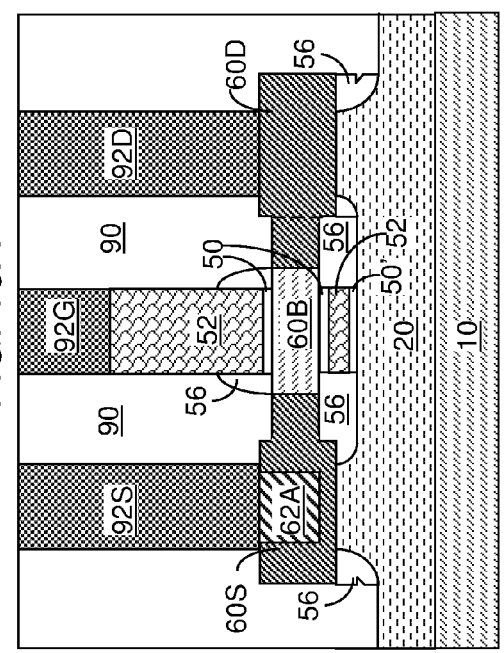
FIG. 16B is a vertical cross-sectional view of the first variation of the first exemplary semiconductor structure along the vertical plane B-B' of FIG. 16A.

Referring to FIGS. 16A-16C, a first variation of the first exemplary semiconductor structure can be derived from the first exemplary semiconductor structure by omitting formation of second semiconductor material drain portion 62B at the processing step corresponding to FIGS. 6A-6C and 7A-7C by modification of the pattern in the photoresist layer 47. In this case, an opening overlying the second semiconductor pad portion 30P2 is omitted during the patterning of the photoresist layer 47. The second semiconductor material source portion 62A alone can apply longitudinal stress along the lengthwise direction of the strained semiconductor nanowires.

Figure 17C:
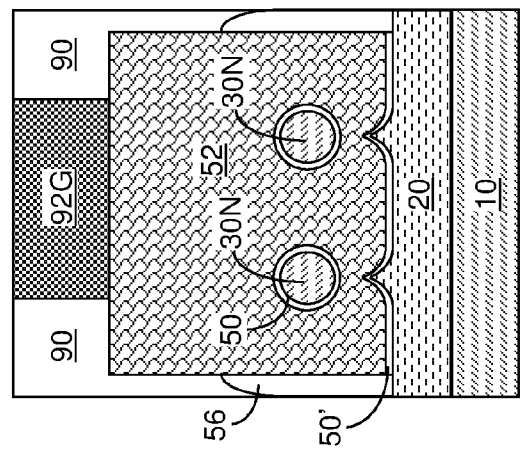
FIG. 17C is a vertical cross-sectional view of the second variation of the first exemplary semiconductor structure along the vertical plane C-C' of FIG. 17A.
Figure 17A:
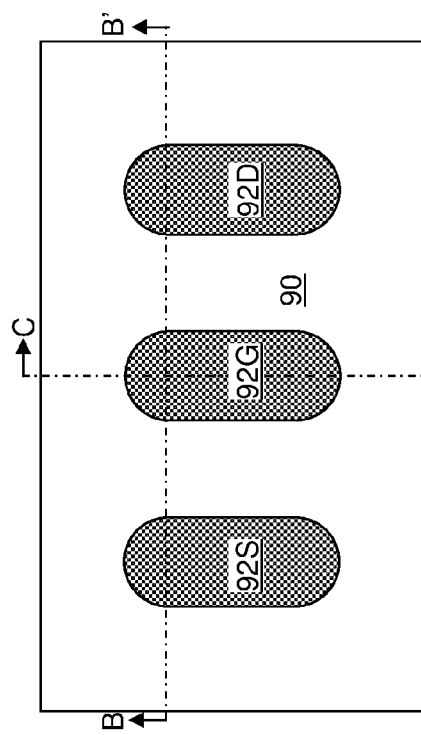
FIG. 17A is a top-down view of a second variation of the first exemplary semiconductor structure after formation of a contact level dielectric layer and various contact via structures according to a third embodiment of the present disclosure.
Figure 17B:
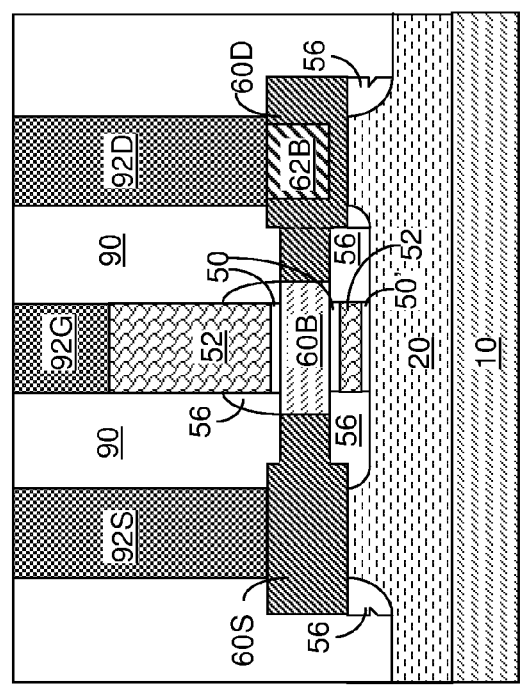
FIG. 17B is a vertical cross-sectional view of the second variation of the first exemplary semiconductor structure along the vertical plane B-B' of FIG. 17A.

Referring to FIGS. 17A-17C, a second variation of the first exemplary semiconductor structure can be derived from the first exemplary semiconductor structure by omitting formation of second semiconductor material source portion 62A at the processing step corresponding to FIGS. 6A-6C and 7A-7C by modification of the pattern in the photoresist layer 47. In this case, an opening overlying the first semiconductor pad portion 30P1 is omitted during the patterning of the photoresist layer 47. The second semiconductor material drain portion 62B alone can apply longitudinal stress along the lengthwise direction of the strained semiconductor nanowires.

Referring to FIGS. 18A-18C, a first variation of the second exemplary semiconductor structure can be derived from the second exemplary semiconductor structure by omitting formation of second semiconductor material drain portion 62B at the processing step corresponding to FIGS. 6A-6C and 7A-7C by modification of the pattern in the photoresist layer 47. In this case, an opening overlying the second semiconductor pad portion 30P2 is omitted during the patterning of the photoresist layer 47. The second semiconductor material source portion 62A alone can apply longitudinal stress along the lengthwise direction of the strained semiconductor nanowires.

Figure 19A:
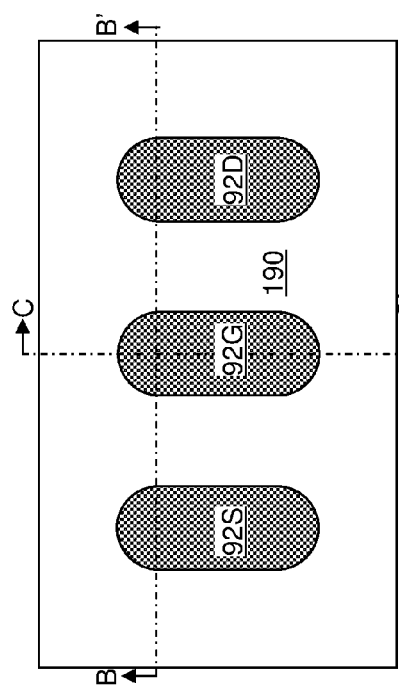
FIG. 19A is a top-down view of a second variation of the second exemplary semiconductor structure after formation of a contact level dielectric layer and various contact via structures according to a third embodiment of the present disclosure.
Figure 19C:
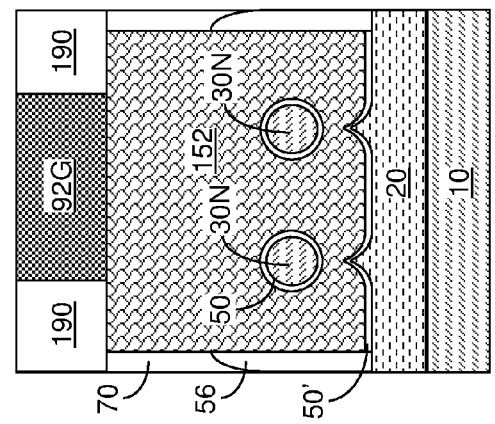
FIG. 19C is a vertical cross-sectional view of the second variation of the second exemplary semiconductor structure along the vertical plane C-C' of FIG. 19A.
Figure 19B:
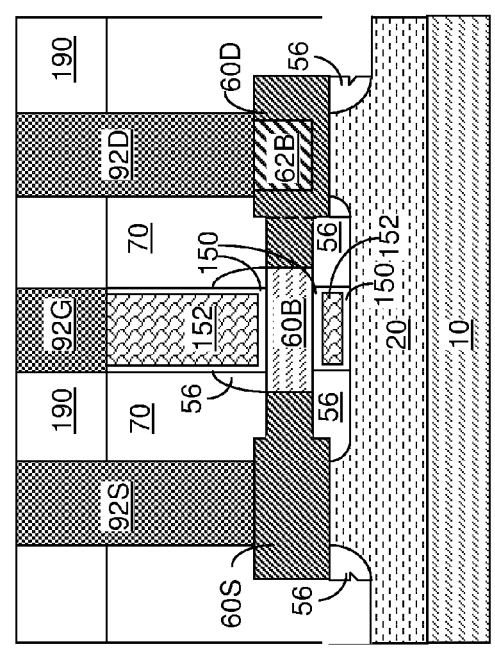
FIG. 19B is a vertical cross-sectional view of the second variation of the second exemplary semiconductor structure along the vertical plane B-B' of FIG. 19A.

Referring to FIGS. 19A-19C, a second variation of the second exemplary semiconductor structure can be derived from the second exemplary semiconductor structure by omitting formation of second semiconductor material source portion 62A at the processing step corresponding to FIGS. 6A-6C and 7A-7C by modification of the pattern in the photoresist layer 47. In this case, an opening overlying the first semiconductor pad portion 30P1 is omitted during the patterning of the photoresist layer 47. The second semiconductor material drain portion 62B alone can apply longitudinal stress along the lengthwise direction of the strained semiconductor nanowires.

Figure 20A:
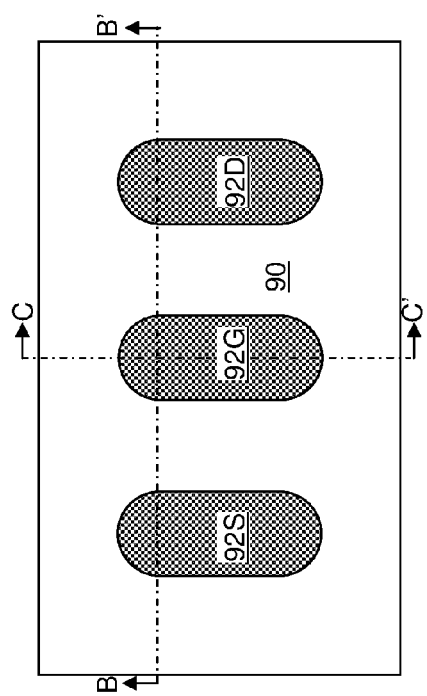
FIG. 20A is a top-down view of a first variation of the third exemplary semiconductor structure after formation of a contact level dielectric layer and various contact via structures according to a third embodiment of the present disclosure.
Figure 20C:
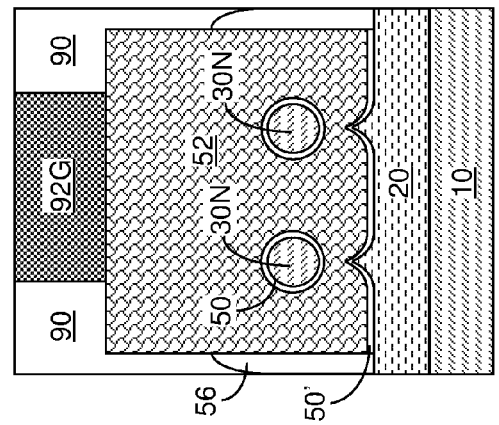
FIG. 20C is a vertical cross-sectional view of the first variation of the third exemplary semiconductor structure along the vertical plane C-C' of FIG. 20A.
Figure 20B:
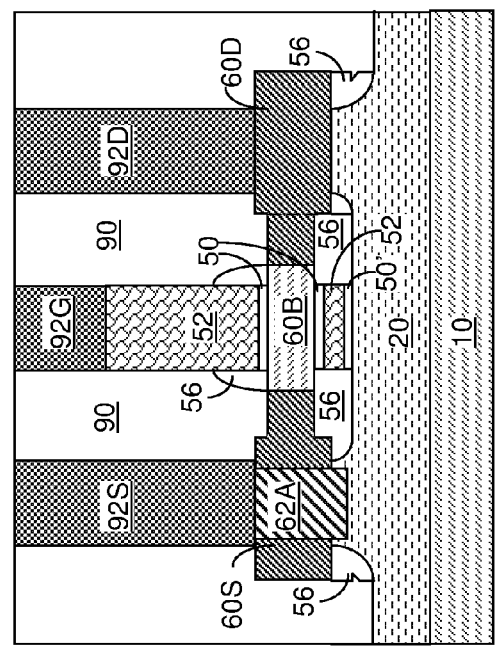
FIG. 20B is a vertical cross-sectional view of the first variation of the third exemplary semiconductor structure along the vertical plane B-B' of FIG. 20A.

Referring to FIGS. 20A-20C, a first variation of the third exemplary semiconductor structure can be derived from the third exemplary semiconductor structure by omitting formation of second semiconductor material drain portion 62B at the processing step corresponding to FIGS. 6A-6C and 7A-7C by modification of the pattern in the photoresist layer 47. In this case, an opening overlying the second semiconductor pad portion 30P2 is omitted during the patterning of the photoresist layer 47. The second semiconductor material source portion 62A alone can apply longitudinal stress along the lengthwise direction of the strained semiconductor nanowires.

Referring to FIGS. 21A-22C, a second variation of the third exemplary semiconductor structure can be derived from the third exemplary semiconductor structure by omitting formation of second semiconductor material source portion 62A at the processing step corresponding to FIGS. 6A-6C and 7A-7C by modification of the pattern in the photoresist layer 47. In this case, an opening overlying the first semiconductor pad portion 30P1 is omitted during the patterning of the photoresist layer 47. The second semiconductor material drain portion 62B alone can apply longitudinal stress along the lengthwise direction of the strained semiconductor nanowires.

The various exemplary semiconductor structures of embodiments of the present disclosure include strained semiconductor nanowires having a tensile strain or a compressive strain along the lengthwise direction of the strained semiconductor nanowires. The tensile strain or the compressive strain in the semiconductor nanowires can be advantageously employed to enhance the minority charge carrier mobility in the field effect transistors within the various exemplary semiconductor structures.

While the disclosure has been described in terms of specific embodiments, it is evident in view of the foregoing description that numerous alternatives, modifications and variations will be apparent to those skilled in the art. Each of the embodiments described herein can be implemented individually or in combination with any other embodiment unless expressly stated otherwise or clearly incompatible. Accordingly, the disclosure is intended to encompass all such alternatives, modifications and variations which fall within the scope and spirit of the disclosure and the following claims.

What is claimed is:

1. A method of forming a semiconductor structure comprising:
    forming a semiconductor material portion on an insulator layer, said semiconductor material portion including a first semiconductor pad portion, a second semiconductor pad portion laterally spaced from said first semiconductor pad portion, and a semiconductor nanowire adjoined to sidewalls of said first and second semiconductor pad portions and suspended over said insulator layer, and said insulator layer including two pedestal portions underlying said first and second semiconductor pad portions;
    forming at least one trench within at least one of said first and second semiconductor pad portions; and
    straining said semiconductor nanowire along a lengthwise direction by filling said at least one trench with a stress-generating material, wherein said filling comprises an epitaxial growth process.

2. The method of claim 1, wherein said two pedestal portions are formed by isotropically etching surface portions of said insulator layer employing said first and second semiconductor pad portions as an etch mask.

3. The method of claim 1, further comprising:
    depositing a planarization material layer over said insulator layer; and
    planarizing said planarization material layer employing top surfaces of said first and second semiconductor pad portions as a stopping surface.

4. The method of claim 3, further comprising:
    applying a photoresist layer over said planarization material layer;
    patterning at least one opening overlying said first or second semiconductor pad portion within said photoresist layer, wherein each of said at least one trench is formed by etching a material of one of said first and second semiconductor pad portions employing said patterned photoresist layer as an etch mask.

5. The method of claim 4, further comprising removing excess portions of said stress-generating material from above said top surfaces of said first and second semiconductor pad portions after deposition of said stress-generating material within said at least one trench.

6. The method of claim 3, further comprising removing said planarization material layer after filling said at least one trench with said stress-generating material.

7. The method of claim 1, wherein said first and second semiconductor pad portions comprise a single crystalline semiconductor material, and said stress-generating material is a single crystalline material that is epitaxially aligned to said single crystalline semiconductor material.

8. The method of claim 1, further comprising:
    a gate dielectric laterally surrounding a portion of said semiconductor nanowire; and
    a gate electrode contacting said gate dielectric.

9. The method of claim 8, further comprising forming a dielectric spacer by:
    depositing a conformal dielectric material layer on said semiconductor material portion and said gate electrode; and
    anisotropically etching said conformal dielectric material layer, wherein remaining portions of said conformal dielectric material layer constitute said dielectric spacer.

10. The method of claim 1, wherein said semiconductor nanowire becomes strained along said lengthwise direction with a tensile strain upon filling of said at least one trench with said stress-generating material.

11. The method of claim 1, wherein said semiconductor nanowire becomes strained along said lengthwise direction with a compressive strain upon filling of said at least one trench with said stress-generating material.

12. The method of claim 1, wherein said forming said semiconductor material portion comprises:
    providing a semiconductor-on-insulator substrate including a top semiconductor material layer located on a surface of said insulator layer;
    patterning said top semiconductor material layer to provide a fin-containing semiconductor portion, said fin-containing semiconductor portion comprising a semiconductor fin, said first semiconductor pad portion and said second semiconductor pad portion;

forming said two pedestal portions beneath said first and second semiconductor pad portions by isotropically etching surface portions of said insulator layer employing said first and second semiconductor pad portions as an etch mask; and recessing physically exposed surfaces of said insulator layer utilizing said fin-containing semiconductor portion as an etch mask to suspend said semiconductor fin, wherein said suspended semiconductor fin provides said semiconductor nanowire.

13. The method of claim 12, further comprising annealing said semiconductor nanowire to provide a rounded vertical cross-sectional shape.

14. The method of claim 1, wherein said at least one trench is formed in both said first and second semiconductor pad portions.

15. The method of claim 1, wherein said at least one stress-generating material has a topmost surface that is coplanar with a topmost surface of said one of said first semiconductor pad portion and said second semiconductor pad portion.

16. The method of claim 1, wherein said stress-generating material is entirely embedded within at least one of said first and second semiconductor pad portions.

17. The method of claim 8, further comprising forming a dielectric spacer including:
  a first dielectric spacer portion laterally surrounding said gate electrode;
  a second dielectric spacer portion laterally surrounding one of said two pedestal portions; and
  a third dielectric spacer portion laterally surrounding another of said two pedestal portions.

18. A method of forming a semiconductor structure comprising:
  forming a semiconductor material portion on an insulator layer, said semiconductor material portion including a first semiconductor pad portion, a second semiconductor pad portion laterally spaced from said first semiconductor pad portion, and a semiconductor nanowire adjoined to sidewalls of said first and second semiconductor pad portions and suspended over said insulator layer, and said insulator layer including two pedestal portions underlying said first and second semiconductor pad portions;
  forming at least one trench within at least one of said first and second semiconductor pad portions; and
  straining said semiconductor nanowire along a lengthwise direction by filling said at least one trench with a stress-generating material, wherein said at least one stress-generating material has a topmost surface that is coplanar with a topmost surface of said one of said first semiconductor pad portion and said second semiconductor pad portion.

19. A method of forming a semiconductor structure comprising:
  forming a semiconductor material portion on an insulator layer, said semiconductor material portion including a first semiconductor pad portion, a second semiconductor pad portion laterally spaced from said first semiconductor pad portion, and a semiconductor nanowire adjoined to sidewalls of said first and second semiconductor pad portions and suspended over said insulator layer, and said insulator layer including two pedestal portions underlying said first and second semiconductor pad portions;
  forming at least one trench within at least one of said first and second semiconductor pad portions; and
  straining said semiconductor nanowire along a lengthwise direction by filling said at least one trench with a stress-generating material, wherein said stress-generating material is entirely embedded within at least one of said first and second semiconductor pad portions.

* * * * *